(12) United States Patent
Lee et al.

(10) Patent No.: US 8,809,839 B2
(45) Date of Patent: Aug. 19, 2014

(54) ORGANIC SEMICONDUCTOR POLYMER, TRANSISTOR INCLUDING AN ORGANIC SEMICONDUCTOR POLYMER AND METHODS OF FABRICATING THE SAME

(75) Inventors: Bang-Lin Lee, Suwon-si (KR); Do-Hwan Kim, Seoul (KR); Jeong-il Park, Seongnam-si (KR); Ji-Youl Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 449 days.

(21) Appl. No.: 12/801,959

(22) Filed: Jul. 6, 2010

(65) Prior Publication Data

US 2011/0001131 A1    Jan. 6, 2011

(30) Foreign Application Priority Data

Jul. 3, 2009 (KR) .................. 10-2009-0060880

(51) Int. Cl.
| | | |
|---|---|---|
| *H01L 29/08* | (2006.01) | |
| *H01L 35/24* | (2006.01) | |
| *H01L 51/00* | (2006.01) | |
| *H01B 1/00* | (2006.01) | |
| *H01B 1/12* | (2006.01) | |

(52) U.S. Cl.
USPC 257/40; 252/500; 257/E51.027; 257/E51.003; 528/9

(58) Field of Classification Search
USPC ............. 252/500; 257/40, E51.003, E51.027; 525/418, 419, 420, 461, 535; 528/9; 544/238, 296; 549/59
See application file for complete search history.

(56) References Cited

U.S. PATENT DOCUMENTS

| | | | |
|---|---|---|---|
| 5,556,524 | A | 9/1996 | Albers |
| 5,946,551 | A | 8/1999 | Dimitrakopoulos et al. |
| 6,166,172 | A | 12/2000 | McCullough et al. |
| 6,232,157 | B1 | 5/2001 | Dodabalapur et al. |
| 7,368,510 | B2 | 5/2008 | Lee et al. |
| 7,374,702 | B2 | 5/2008 | Marks et al. |
| 2004/0054095 | A1* | 3/2004 | Allen et al. .................. 525/418 |
| 2006/0124909 | A1 | 6/2006 | Marks et al. |
| 2008/0182371 | A1 | 7/2008 | Gehring et al. |

(Continued)

FOREIGN PATENT DOCUMENTS

| | | |
|---|---|---|
| EP | 0 414 906 A1 | 3/1991 |
| EP | 2 006 291 A1 | 12/2008 |

(Continued)

OTHER PUBLICATIONS

Myung-Han Yoon, Antonio Facchetti, Charlotte E. Stern, and Tobin J. Marks, Fluorocarbon-Modified Organic Semiconductors: Molecular Architecture, Electronic, and Crystal Structure Tuning of Arene—versus Fluoroarene-Thiophene Oligomer Thin-Film Properties, J. Am. Chem. Soc. 2006, 128, 5792-5801.*

(Continued)

*Primary Examiner* — Bijan Ahvazi
(74) *Attorney, Agent, or Firm* — Harness, Dickey & Pierce, P.L.C.

(57) ABSTRACT

An organic semiconductor polymer, a transistor including an organic semiconductor polymer and methods of fabricating the same are provided, the organic semiconductor polymer including an aromatic or heteroaromatic main chain and at least one of a fluoro or a perfluoroalkyl at a polymer terminal end.

27 Claims, 10 Drawing Sheets

(56) References Cited

U.S. PATENT DOCUMENTS

| | | |
|---|---|---|
| 2008/0293937 A1 | 11/2008 | Marks et al. |
| 2009/0023842 A1 | 1/2009 | Laird et al. |
| 2009/0065770 A1 | 3/2009 | Miura et al. |
| 2011/0001131 A1 | 1/2011 | Lee et al. |

FOREIGN PATENT DOCUMENTS

| | | | |
|---|---|---|---|
| JP | 0414906 A1 * | 8/1990 | |
| JP | 2008097949 A | 4/2008 | |
| JP | 2008195911 A | 8/2008 | |
| KR | 20060056824 A | 5/2006 | |
| KR | 10-2007-0106976 A | 11/2007 | |
| KR | 20090113990 A | 11/2009 | |
| KR | 20090118598 A | 11/2009 | |
| KR | 20100031566 A | 3/2010 | |
| WO | WO-0209201 A1 | 1/2002 | |
| WO | WO-2008144750 A1 | 11/2008 | |

OTHER PUBLICATIONS

European Search Report dated Nov. 11, 2010 in corresponding European Application No. 10167763.1.
Pham et al. (J. Org. Chem, 1984, vol. 49, pp. 5250-5253.
Yamamoto et al. (Macromolecules 1992, vol. 25, pp. 1214-1223).
Stille et al. (Angew. Chem. Int. Ed. Engl. 1986, vol. 25, pp. 508-524).
Suzuki et al. (J. Am. Chem. Soc. 1989, vol. 111, pp. 314-321).

* cited by examiner

ORGANIC SEMICONDUCTOR POLYMER, TRANSISTOR INCLUDING AN ORGANIC SEMICONDUCTOR POLYMER AND METHODS OF FABRICATING THE SAME

CROSS-REFERENCE TO RELATED APPLICATION

This application claims priority to and the benefit of priority under 35 U.S.C. §119 from Korean Patent Application No. 10-2009-0060880 filed in the Korean Intellectual Property Office on Jul. 3, 2009, the entire contents of which are incorporated herein by reference.

BACKGROUND

1. Field

Example embodiments relate to an organic semiconductor polymer, a transistor including an organic semiconductor polymer and methods of fabricating the same.

2. Description of the Related Art

Progressing in an information-oriented society requires the development of a new image display device that addresses the drawbacks of the conventional cathode ray tube (CRT), the drawbacks including a heavy weight and/or a large volume. Several flat panel displays (e.g., a liquid crystal display (LCD), an organic light emitting diode (OLED) display, a plasma display panel (PDP), a surface-conduction electron-emitter display (SED) and similar displays) are drawing attention.

A thin film transistor (TFT) including a semiconductor layer of amorphous silicon is generally used for a switching device in flat panel displays.

The amorphous silicon thin film transistor is used because good uniformity and high electrical characteristics are observed in a doping state, and good insulating characteristics are observed in a non-doping state.

If depositing the conventional amorphous silicon thin film transistor on a substrate, there are limits in carrying out the process at a high temperature of about 300° C., making it difficult to apply the conventional amorphous silicon thin film to a polymer substrate for a flexible display.

In order to address the problems observed with the conventional amorphous silicon thin film, an organic thin film transistor (OTFT) using an organic semiconductor material has been suggested.

The organic thin film transistor generally includes a substrate, a gate electrode, an insulation layer, a source electrode, a drain electrode and a channel region. The transistor may be classified as a bottom contact (BC) type in which a channel region is formed on the source electrode and the drain electrode (and after formation of a metal electrode), or a top contact (TC) type of which a metal electrode is formed on, and after, the channel region due to mask deposition.

The low molecular, or oligomer, organic semiconductor material filled in the channel region of the organic thin film transistor (OTFT) may include merocyanine, phthalocyanine, perylene, pentacene, C60, a thiophene oligomer and/or similar compounds. The low molecular, or oligomer, organic semiconductor material may be a thin film formed on the channel region according to a vacuum process.

SUMMARY

Example embodiments relate to an organic semiconductor polymer, a transistor including an organic semiconductor polymer and methods of fabricating the same.

Example embodiments provide an organic semiconductor polymer, which imparts increased charge mobility, electrical stability and/or air stability, and a method of fabricating the same using a solution-based process.

Example embodiments provide a transistor including an organic semiconductor polymer, which has increased charge mobility, electrical stability and/or air stability, and a method of fabricating the same using a solution-based process.

Other example embodiments provide an electronic device including an organic semiconductor polymer, and a method of fabricating the same using a solution-based process.

According to example embodiments, an organic semiconductor polymer represented by Chemical Formula (1), shown below, is provided.

CHEMICAL FORMULA (1)

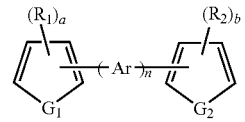

In Chemical Formula (1), $G_1$ and $G_2$ may be the same, or different, and may be independently selected from the group consisting of —O—, —S—, -Se—, —$CR_3R_4$—$CR_5R_6$—, —$CR_7$=$CR_8$—, and —$CR_9$=N—, where $R_3$ to $R_9$ are the same, or different, and are independently selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl, and combinations thereof.

According to other example embodiments, $R_3$ to $R_9$ may be the same or different and may be independently selected from the group consisting of the fluoro, the C1 to C20 partially fluorinated fluoroalkyl, the C1 to C20 perfluoroalkyl ($C_nF_{2n+1}$) and combinations thereof.

In Chemical Formula (1), $R_1$ and $R_2$ may be the same, or different, and may be independently selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl, and combinations thereof.

According to other example embodiments, $R_1$ and $R_2$ may be the same or different and may be independently selected from the group consisting of the fluoro, the C1 to C20 partially fluorinated fluoroalkyl, the C1 to C20 perfluoroalkyl ($C_nF_{2n+1}$) and combinations thereof.

In Chemical Formula (1), Ar is a substituted or unsubstituted C6 to C30 aromatic ring, a substituted or unsubstituted C3 to C14 heteroaromatic ring, for example, a substituted or unsubstituted C4 to $C_{14}$ heteroaromatic ring, or a substituted or unsubstituted C6 to C30 condensed polycycle.

In Chemical Formula (1), n is a polymerization degree and an integer of 8 or more. In Chemical Formula (1), a and b are independently integers ranging from 1 to 3, provided that if $G_1$ and $G_2$ are —O—, —S— or —Se—, then at least one of $R_1$ and $R_2$ is a fluoro or a C1 to C20 perfluoroalkyl, and provided that if $G_1$ and $G_2$ are —$CR_3R_4$—$CR_5R_6$—, —$CR_7$=$CR_8$— or —$CR_9$=N—, then at least one of $R_1$ to $R_9$ is a fluoro or a C1 to C20 perfluoroalkyl.

The organic semiconductor polymer may be a p-type organic semiconductor polymer.

In Chemical Formula (1), Ar includes at least one thiophene moiety. For example, Ar may be represented by Chemical Formula (2), shown below.

CHEMICAL FORMULA (2)

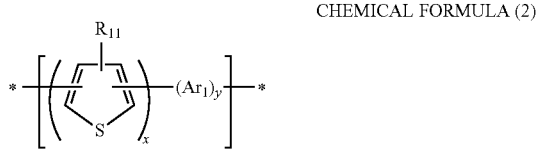

In Chemical Formula (2), $R_{11}$ is hydrogen or a C1 to C20 alkyl, $Ar_1$ is selected from the group consisting of a C6 to C30 arylene, a C6 to C30 condensed polycycle, a C3 to C30 heteroaromatic group, a C3 to C30 heteroaromatic group including at least one electron withdrawing imine nitrogen atom, and combinations thereof, x is an integer ranging from 1 to 12, and y is an integer ranging from 1 to 4.

In Chemical Formula (1), Ar may be represented by at least one of the following Chemical Formulae (4) to (6).

CHEMICAL FORMULA (4)

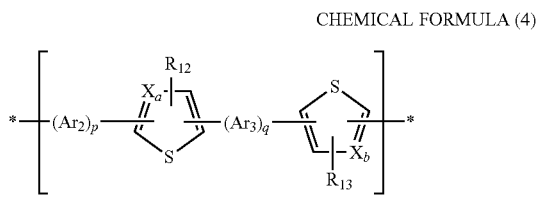

In Chemical Formula (4), $Ar_2$ and $Ar_3$ are independently a C3 to C30 arylene or a C3 to C30 heteroarylene, p and q are independently 0 to 2, $X_a$ and $X_b$ are independently N or CH, and $R_{12}$ and $R_{13}$ are the same or different and are independently hydrogen or a C1 to C20 alkyl.

CHEMICAL FORMULA (5)

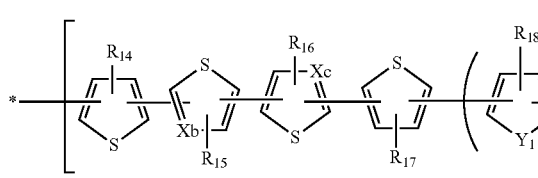

In Chemical Formula (5), $X_b$ and $X_c$ are the same or different and are independently N or CH, $Y_1$ and $Y_2$ are the same or different and are independently S or Se, $R_{14}$ to $R_{19}$ are the same or different and are independently hydrogen or a C1 to C20 alkyl, and m is 0 to 2.

CHEMICAL FORMULA (6)

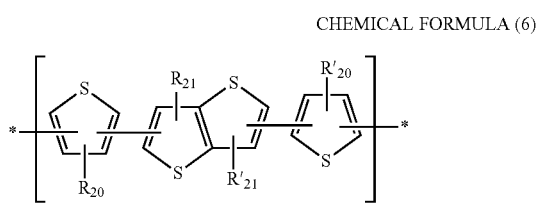

In Chemical Formula (6), $R_{20}$, $R'_{20}$, $R_{21}$, and $R'_{21}$ are the same or different and are independently hydrogen or a C1 to C20 alkyl.

Chemical Formula (5), for example, may be represented by Chemical Formula (5-1) or Chemical Formula (5-2), both shown below.

CHEMICAL FORMULA (5-1)

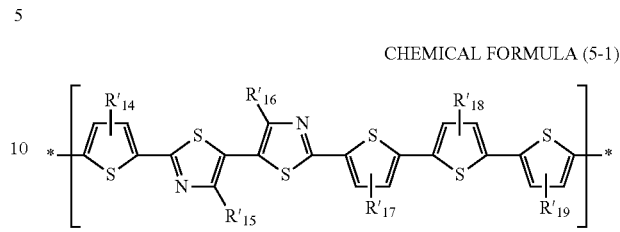

CHEMICAL FORMULA (5-2)

In Chemical Formulae (5-1) and (5-2), $R'_{14}$ to $R'_{19}$ are the same or different and are independently hydrogen or a C1 to C20 alkyl.

Chemical Formula (6), for example, may be represented by Chemical Formula (6-1), shown below.

CHEMICAL FORMULA (6-1)

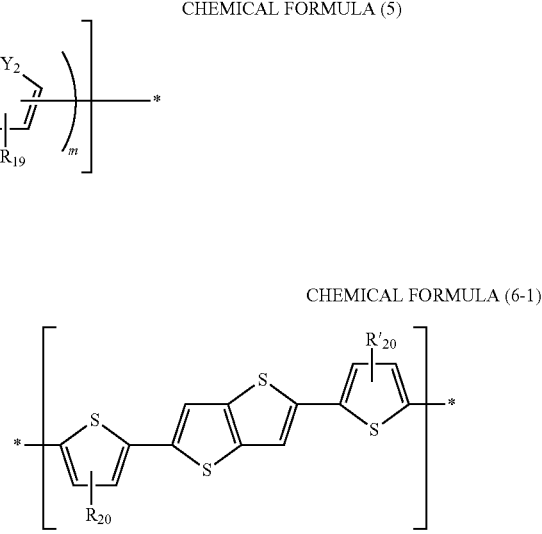

In Chemical Formula (6-1), $R_{20}$ and $R'_{20}$ are the same or different and are independently hydrogen or a C1 to C20 alkyl.

The organic semiconductor polymer may include a terminal functional group represented by Chemical Formulae (7) to (10), shown below.

CHEMICAL FORMULA (7)

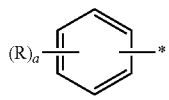

In Chemical Formula (7), R is a fluoro or a C1 to C20 perfluoroalkyl, and a is an integer ranging from 1 to 5.

CHEMICAL FORMULA (8)

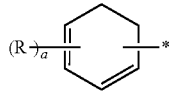

In Chemical Formula (8), R is a fluoro or a C1 to C20 perfluoroalkyl and a is an integer ranging from 1 to 6.

CHEMICAL FORMULA (9)

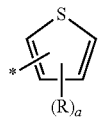

In Chemical Formula (9), R is a fluoro or a C1 to C20 perfluoroalkyl, and a is an integer ranging from 1 to 3.

CHEMICAL FORMULA (10)

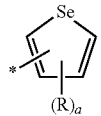

In Chemical Formula (10), R is a fluoro or a C1 to C20 perfluoroalkyl and a is an integer ranging from 1 to 3.

According to example embodiments, a transistor including the organic semiconductor polymer is provided.

The transistor includes a gate electrode positioned on a substrate, a source electrode and a drain electrode facing each other and defining a channel region, an insulation layer that electrically insulates the source electrode, the drain electrode and the gate electrode, and an active layer including the organic semiconductor polymer in the channel region.

According to example embodiments, an electronic device including the organic semiconductor polymer is provided. The electronic device may be a memory device, an organic light emitting diode (OLED), an electronic paper (e-paper), a radio-frequency identification (RFID) tag, a flat-panel display including an active-matrix flat-panel display (AMFPD), a sensor including a photosensor, a biosensor, a chemical sensor or combinations thereof (e.g., a biochemical sensor, photochemical sensor, etc.), a laser device, a photovoltaic device (e.g., a solar cell) or similar devices.

Yet other example embodiments relate to a method of synthesizing an organic semiconductor polymer including forming the organic semiconductor polymer having Chemical Formula (1) by reacting monomer (1A) with compound (1B) to as shown in Reaction Scheme (1), as shown below.

REACTION SCHEME (1)

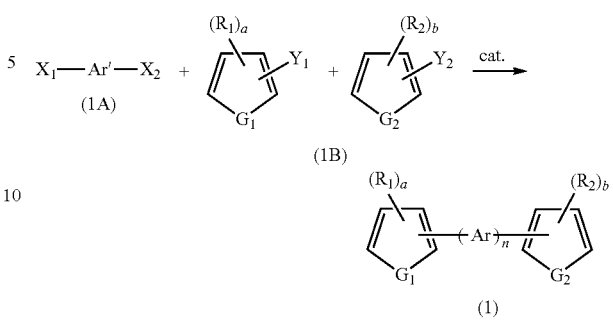

In Reaction Scheme (1), $X_1$, $X_2$, $Y_1$, and $Y_2$ are independently reactive groups selected from the group consisting of a halogen group, a trialkyl tin group, and a borane group.

In Reaction Scheme (1), $G_1$ and $G_2$ may be the same, or different, and may be independently selected from the group consisting of —O—, —S—, —Se—, —$CR_3R_4$—$CR_5R_6$—, —$CR_7$=$CR_9$—, and —$CR_9$=N—, where $R_3$ to $R_9$ are the same or different and are independently selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof.

According to other example embodiments, $R_3$ to $R_9$ may be the same, or different, and may be independently selected from the group consisting of the fluoro, the C1 to C20 partially fluorinated fluoroalkyl, the C1 to C20 perfluoroalkyl ($C_nF_{2n+1}$) and combinations thereof.

In Reaction Scheme (1), $R_1$ and $R_2$ may be the same, or different, and may be independently selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof.

According to other example embodiments, $R_1$ and $R_2$ may be the same, or different, and may be independently selected from the group consisting of the fluoro, the C1 to C20 partially fluorinated fluoroalkyl, the C1 to C20 perfluoroalkyl ($C_nF_{2n+1}$) and combinations thereof.

In Reaction Scheme (1), Ar and Ar' are independently a substituted or unsubstituted C6 to C30 aromatic ring, a substituted or unsubstituted C3 to C14 heteroaromatic ring, or a substituted or unsubstituted C6 to C30 condensed polycycle.

In Reaction Scheme (1), n is a polymerization degree and an integer of 8 or more. In Reaction Scheme (1), a and b are independently integers ranging from 1 to 3 provided that, if $G_1$ and $G_2$ are —O—, —S—, or —Se—, then at least one of $R_1$ and $R_2$ is a fluoro or a C1 to C20 perfluoroalkyl, and provided that if $G_1$ and $G_2$ are —$CR_3R_4$—$CR_5R_6$—, —$CR_7$=$CR_8$—, or —$CR_9$=N—, at least one of $R_1$ to $R_9$ is a fluoro or a C1 to C20 perfluoroalkyl.

Compound (1B) may be used in an amount of about 5 to about 10 equivalents with respect to the monomer (1A).

The trialkyl tin group may be represented by Chemical Formula (38), shown below.

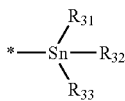
CHEMICAL FORMULA (38)

In Chemical Formula (38), R31 to R33 are the same or different and are independently hydrogen or a C1 to C7 alkyl, provided that at least one of R31 to R33 is an alkyl.

The borane group may be represented by one of Chemical Formula (39) or Chemical Formula (40), as shown below.

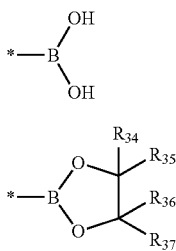

CHEMICAL FORMULA (39)

CHEMICAL FORMULA (40)

In Chemical Formula (40), $R_{34}$ to $R_{37}$ are the same or different and are independently hydrogen or a C1 to C7 alkyl, provided that at least one of $R_{34}$ to $R_{37}$ is an alkyl.

The method may include performing the reaction of monomer (1A) with compound (1B) in the presence of a catalyst. The catalyst may be an organic metal catalyst represented by one of Chemical Formulae (41-1) to (41-4), as shown below.

CHEMICAL FORMULA (41-1)

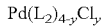

CHEMICAL FORMULA (41-2)

In Chemical Formulae (41-1) and (41-2), $L_1$ and $L_2$ are ligands selected from the group consisting of triphenylphosphine ($PPh_3$), 1,4-bis(diphenylphosphine)butane (dppb), 1,1'-bis(diphenylphosphino)ferrocene (dppf), acetate (OAc), triphenyl arsine ($AsPh_3$) and triphenylphosphite ($P(OPh)_3$), x is an integer ranging from 2 to 4, and y is an integer ranging from 1 to 3.

CHEMICAL FORMULA (41-3)

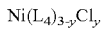

CHEMICAL FORMULA (41-4)

In Chemical Formulae (41-3) and (41-4), $L_3$ and $L_4$ are ligands selected from the group consisting of a bis(diphenylphosphino)alkane and a cycloalkene, and x is an integer of 2 or 3, and y is an integer of 1 or 2.

The bis(diphenylphosphino)alkane may be selected from the group consisting of 1,3-bis(diphenylphosphino)propane (dppp), 1,2-bis(diphenylphosphino)ethane (dppe), 1,4-bis(diphenylphosphino)butane (dppb) and combinations thereof. The cycloalkene may be 1,5-cyclooctadiene (COD).

Hereinafter, further aspects of this disclosure will be described in detail.

BRIEF DESCRIPTION OF THE DRAWINGS

Example embodiments will be more clearly understood from the following detailed description taken in conjunction with the accompanying drawings.

FIG. 1 is a schematic cross-sectional view of a transistor according to example embodiments.

FIG. 2 is a schematic cross-sectional view of a transistor according to example embodiments.

FIG. 3 is a schematic cross-sectional view of liquid crystal display including a transistor according to example embodiments.

FIG. 4 shows $^1H$ NMR spectra of the Poly-1 polymer according to Example 1 and the Poly-1A polymer according to Comparative Example 1.

FIG. 5 shows $^{19}F$ NMR spectra of the Poly-1 polymer according to Example 1 and the Poly-1A polymer according to Comparative Example 1.

FIG. 6 shows a $^{19}F$ NMR spectrum of the Poly-2 according to Example 2.

FIG. 7 is a graph showing results of on-state current transfer characteristics in air of the organic thin film transistor (OTFT) device according to Example 6.

FIG. 8 is a graph showing results of on-state current transfer characteristics in air of the organic thin film transistor (OTFT) device according to Comparative Example 2.

FIGS. 9 and 10 are graphs showing results of off-state current transfer characteristics in air of the organic thin film transistor (OTFT) devices according to Example 2 (FIG. 9) and Comparative Example 2 (FIG. 10), respectively.

DETAILED DESCRIPTION

Figure 1:
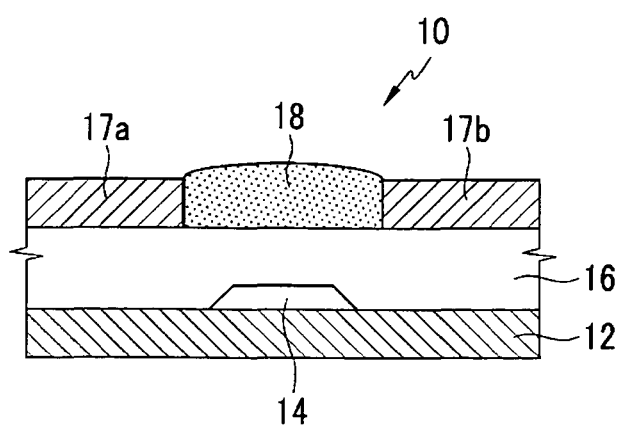
FIGS. 1-10 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the disclosure may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thickness of layers, films, panels, etc., are exaggerated for clarity. Like reference numerals designate like elements throughout the specification. Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). If an element such as a layer, film, or substrate is referred to as being "on" another element, it can be directly on the other element or intervening elements may also be present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe a relationship between one element or a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

As used herein, if a definition is not provided, then the terminology "aromatic group" or "aromatic ring" refers to a functional group including a C4 to C30 aromatic cyclic group, and the terminology "heteroaromatic group" or "heteroaromatic ring" refers to a C3 to C30 heteroaryl or a C3 to C30 heterocycloalkenyl. As used herein, if a definition is not otherwise provided, then the terminology "condensed polycycle" refers to a fused ring of at least two cyclic groups selected from the group consisting of the above-described aromatic group and heteroaromatic group, and a non-aromatic or non-heteroaromatic group such as a C3 to C30 cycloalkyl, and a C3 to C30 cycloalkenyl. As used herein, if a definition is not otherwise provided, then the terms "heteroaryl" or "heteroarylene" refers to a C3 to C30 heteroaryl or heteroarylene, the terms "aryl" or "arylene" refers to a C6 to C30 aryl or arylene, and the term "alkyl" refers to a C1 to C30 alkyl.

As used herein, if a specific definition is not otherwise provided, then the term "hetero" refers to one including heteroatoms selected from the group consisting of N, O, S, Si, and P, and including 1 to 4 heteroatoms in one ring.

As used herein, if a specific definition is not otherwise provided, then the term "substituted" refers to one substituted with at least a functional group selected from the group consisting of a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof in a functional group or a compound.

As used herein, if a specific definition is not otherwise provided, then the term "unsubstituted" refers to one that does not have any of the aforementioned substituents, excluding end-capping functional groups.

Example embodiments relate to an organic semiconductor polymer, a transistor including an organic semiconductor polymer and methods of fabricating the same.

According to example embodiments, an organic semiconductor polymer represented by Chemical Formula (1), shown below, is provided.

CHEMICAL FORMULA (1)

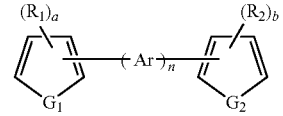

In Chemical Formula (1), $G_1$ and $G_2$ are the same or different, and are independently selected from the group consisting of —O—, —S—, —Se—, —$CR_3R_4$—$CR_5R_6$—, —$CR_7$=$CR_9$—, and —$CR_9$=N—, where $R_3$ to $R_9$ are the same or different and are independently selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof. In Chemical Formula (1), $R_1$ and $R_2$ are the same or different and are independently selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof.

In Chemical Formula (1), Ar is a substituted or unsubstituted C6 to C30 aromatic ring, a substituted or unsubstituted C3 to C14 heteroaromatic ring, or a substituted or unsubstituted C6 to C30 condensed polycycle.

In Chemical Formula (1), n refers to a polymerization degree, and is an integer of 8 or more. In Chemical Formula (1), a and b are independently integers ranging from 1 to 3 provided that if $G_1$ and $G_2$ are —O—, —S—, or —Se—, then at least one of $R_1$ and $R_2$ is a fluoro or a C1 to C20 perfluoroalkyl, and provided that if $G_1$ and $G_2$ are —$CR_3R_4$—$CR_5R_6$—, —$CR_7$=$CR_6$—, or —$CR_9$=N—, then at least one of $R_1$ to $R_9$ is a fluoro or a C1 to C20 perfluoroalkyl.

If a and b are 2 or 3, then $R_1$ and $R_2$ are present in plural and a plurality of $R_1$ and $R_2$ are the same or different from each other.

In Chemical Formula (1), n refers to a polymerization degree and may be an integer of 8 or more, or an integer of 8 to 200. The organic semiconductor polymer may have a number average molecular weight (Mn) of about 5,000 to about 200,000 and/or about 10,000 to about 50,000 (e.g., about 5,000 to about 50,000 or about 10,000 to about 200,000).

The organic semiconductor polymer may be a p-type organic semiconductor polymer.

Ar may include at least one thiophene moiety. For example, Ar may be represented by Chemical Formula (2), shown below.

CHEMICAL FORMULA (2)

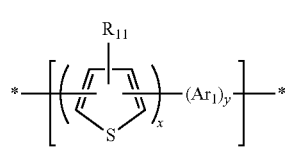

In Chemical Formula (2), $R_{11}$ is hydrogen or a C1 to C20 alkyl, $Ar_1$ is selected from the group consisting of a C6 to C30 arylene, a C6 to C30 condensed polycycle, a C3 to C30 heteroaromatic group, a C3 to C30 heteroaromatic group including at least one electron withdrawing imine nitrogen atom, or combinations thereof, x is an integer ranging from 1 to 12, and y is an integer ranging from 1 to 4. In Chemical Formula (2), a thiophene moiety repeating unit and an $Ar_1$ repeating unit may be arranged alternately, or randomly.

The C6 to C30 arylene or the C3 to C30 heteroaromatic group including at least one electron withdrawing imine nitrogen atom includes functional groups represented by Chemical Formulae (3-1) to (3-27), shown below, but is not limited thereto.

Chemical Formulae (3-1) to (3-27)

 (3-1)

 (3-2)

 (3-3)

 (3-4)

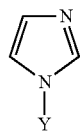 (3-5)

 (3-6)

 (3-7)

 (3-8)

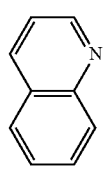 (3-9)

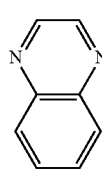 (3-10)

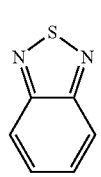 (3-11)

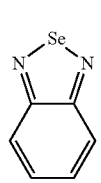 (3-12)

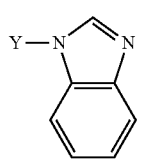 (3-13)

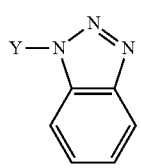 (3-14)

 (3-15)

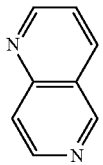 (3-16)

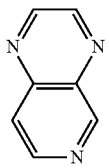 (3-17)

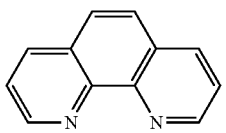 (3-18)

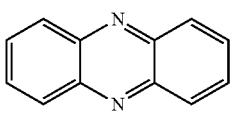 (3-19)

 (3-20)

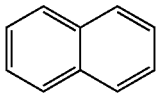 (3-21)

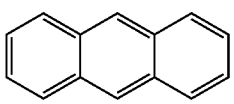 (3-22)

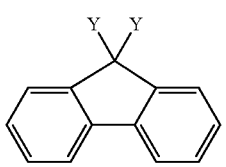 (3-23)

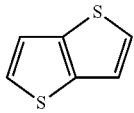 (3-24)

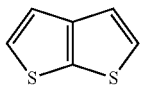 (3-25)

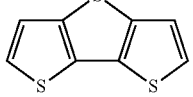 (3-26)

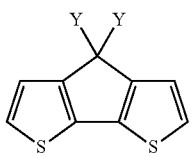 (3-27)

In Chemical Formulae (3-1) to (3-27), Y is hydrogen, a C1 to C20 linear or branched alkyl, a C3 to C20 cycloalkyl, a C6 to C30 aryl, a C1 to C16 linear or branched alkoxy, or a C3 to C16 cycloalkoxyalkyl.

The C3 to C30 heteroaromatic group including at least one electron withdrawing imine nitrogen atom includes thiazole, thiadiazole, oxazole, isoxazole, oxadiazole, imidazole, pyrazole, triazole, tetrazole, pyridine, pyridazine, quinoline, isoquinoline, quinoxaline, naphthyridine, benzoimidazole, pyrimidine, pyrimidopyrimidine, pyridopyrimidine, benzothiadiazole, benzoselenadiazole, benzotriazole, benzothiazole, benzooxazole, phenanthroline, phenazine, phenanthridine and similar compounds.

Ar may be represented by at least one of Chemical Formulae (4) to (6), all shown below. The repeating units of Chemical Formulae (4) to (6) may be arranged alternately, or randomly, in combination to constitute the Ar main chain of Chemical Formula (1).

CHEMICAL FORMULA (4)

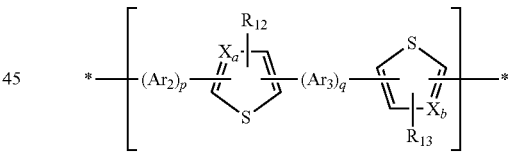

In Chemical Formula (4), $Ar_2$ and $Ar_3$ are independently a C3 to C30 arylene or a C3 to C30 heteroarylene (e.g., benzene, fluorene, pyridine or quinoxaline), p and q are independently 0 to 2, $X_a$ and $X_b$ are independently N or CH, and $R_{12}$ and $R_{13}$ are the same or different and are independently hydrogen or a C1 to C20 alkyl (e.g., $C_6H_{13}$, $C_8H_{17}$, $C_{10}H_{21}$, $C_{12}H_{25}$, $C_{14}H_{29}$ or $C_{16}H_{33}$).

CHEMICAL FORMULA (5)

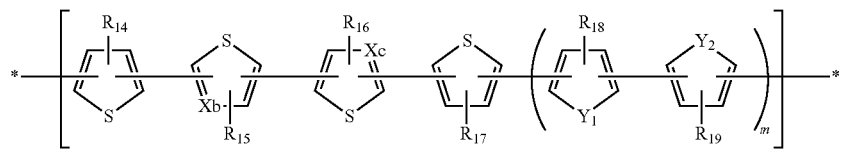

In Chemical Formula (5), $X_b$ and $X_c$ are the same or different, and are independently selected from the group consisting of N or CH, $Y_1$ and $Y_2$ are the same or different and are independently S or Se, $R_{14}$ to $R_{19}$ are the same or different and are independently hydrogen or a C1 to C20 alkyl (e.g., $C_6H_{13}$, $C_8H_{17}$, $C_{10}H_{21}$, $C_{12}H_{25}$, $C_{14}H_{29}$ or $C_{16}H_{33}$), and m is 0 or 1. The $R_{14}$, $R_{17}$, $R_{18}$, and $R_{19}$ groups may be present, respectively, in a five-membered ring in twos (e.g., two $R_{14}$ groups may be present in a five-membered ring, and/or two $R_{18}$ groups may be present in another five-membered ring), and the two respective groups in each ring may be the same or different from each other.

CHEMICAL FORMULA (6)

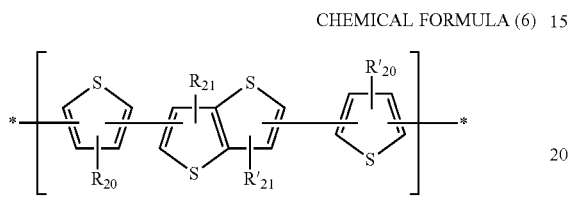

In Chemical Formula (6), $R_{20}$, $R'_{20}$, $R_{21}$, and $R'_{21}$ are the same or different, and are independently hydrogen or a C1 to C20 alkyl (e.g., $C_6H_{13}$, $C_3H_{17}$, $C_{10}H_{21}$, $C_{12}H_{25}$, $C_{14}H_{29}$, or $C_{16}H_{33}$). The $R_{20}$ and $R'_{20}$ groups may be present, respectively, in a five-membered ring in twos, and the two respective groups in each ring may be the same or different from each other.

Chemical Formula (5), for example, may be Chemical Formula (5-1) or Chemical Formula (5-2), both shown below.

CHEMICAL FORMULA (5-1)

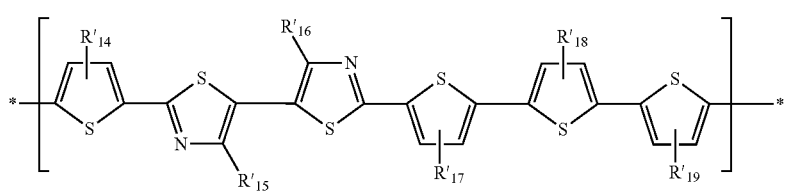

In Chemical Formula (5-1), $R'_{14}$ to $R'_{19}$ are the same or different, and are independently hydrogen or a C1 to C20 alkyl (e.g., $C_6H_{13}$, $C_8H_{17}$, $C_{10}H_{21}$, $C_{12}H_{25}$, $C_{14}H_{29}$ or $C_{16}H_{33}$). The $R'_{14}$, $R'_{17}$, $R'_{18}$, and $R'_{19}$ groups may be present, respectively, in a five-membered ring in twos, and the two respective groups in each ring may be the same or different from each other.

CHEMICAL FORMULA (5-2)

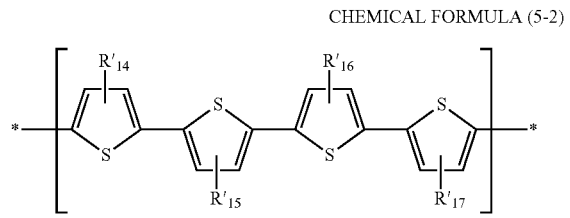

In Chemical Formula (5-2), $R'_{14}$ to $R'_{17}$ are the same or different, and are independently hydrogen or a C1 to C20 alkyl (e.g., $C_6H_{13}$, $C_8H_{17}$, $C_{10}H_{21}$, $C_{12}H_{25}$, $C_{14}H_{29}$ or $C_{16}H_{33}$). The $R'_{14}$ to $R'_{17}$ groups may be present, respectively, in a five-membered ring in twos, and the two groups in each ring may be the same or different from each other.

Chemical Formula (6), for example, may be Chemical Formula (6-1), shown below.

CHEMICAL FORMULA (6-1)

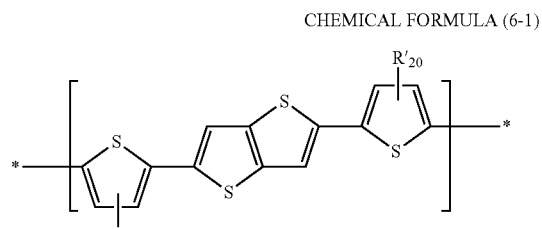

In Chemical Formula (6-1), $R_{20}$ and $R'_{20}$ are the same or different, and are independently hydrogen or a C1 to C20 alkyl (e.g., $C_6H_{13}$, $C_8H_{17}$, $C_{10}H_{21}$, $C_{12}H_{25}$, $C_{14}H_{29}$ or $C_{16}H_{33}$). The $R'_{20}$ and $R'_{20}$ groups may be present, respectively, in a five-membered ring in twos, and the two respective groups in each ring may be the same or different from each other.

The organic semiconductor polymer may include a terminal functional group represented by Chemical Formulae (7) to (10), shown below.

CHEMICAL FORMULA (7)

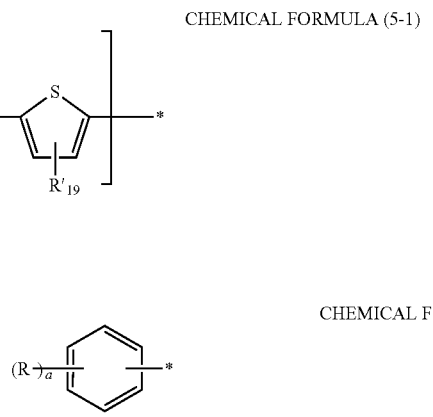

In Chemical Formula (7), R is a fluoro or a C1 to C20 perfluoroalkyl, and a is an integer ranging from 1 to 5, or an integer ranging from 1 to 4.

CHEMICAL FORMULA (8)

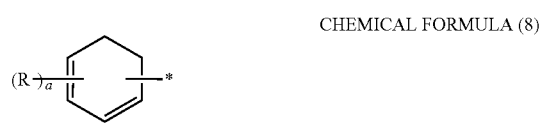

In Chemical Formula (8), R is a fluoro or a C1 to C20 perfluoroalkyl, and a is an integer ranging from 1 to 6, or an integer ranging from 1 to 5.

CHEMICAL FORMULA (9)

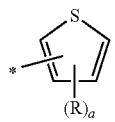

In Chemical Formula (9), R is a fluoro or a C1 to C20 perfluoroalkyl, and a is an integer ranging from 1 to 3 or 1 to 2.

CHEMICAL FORMULA (10)

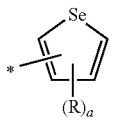

In Chemical Formula (10), R is a fluoro or a C1 to C20 perfluoroalkyl, and a is an integer ranging from 1 to 3, or an integer from 1 to 2.

Non-limiting examples of the organic semiconductor polymer may include the compounds represented by Chemical Formulae (11) to (37), shown below. In Chemical Formulae (11) to (37), n is the same as in the above Chemical Formula (1).

CHEMICAL FORMULA (11)

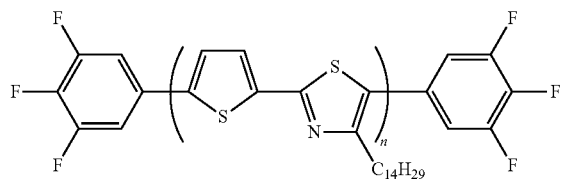

CHEMICAL FORMULA (12)

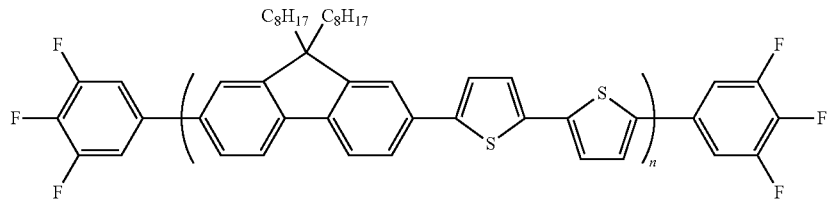

CHEMICAL FORMULA (13)

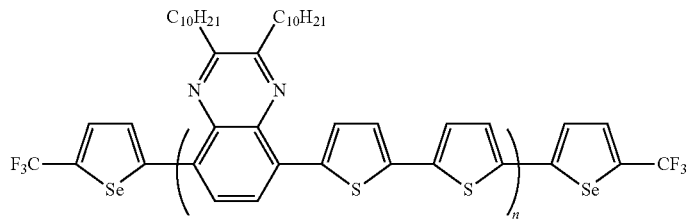

CHEMICAL FORMULA (14)

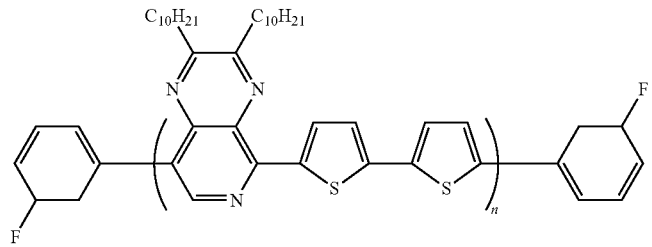

CHEMICAL FORMULA (15)

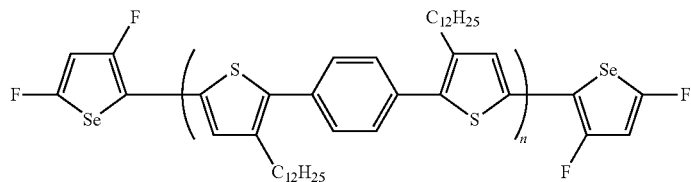

-continued
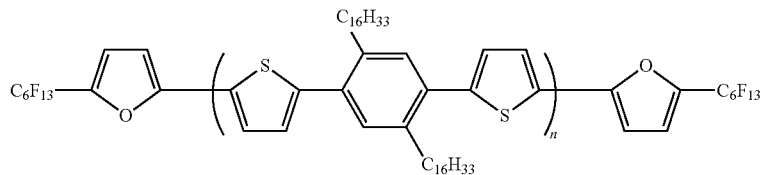
CHEMICAL FORMULA (16)
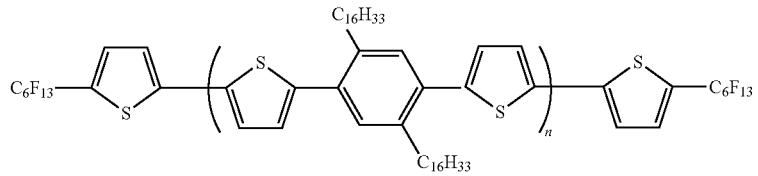
CHEMICAL FORMULA (17)
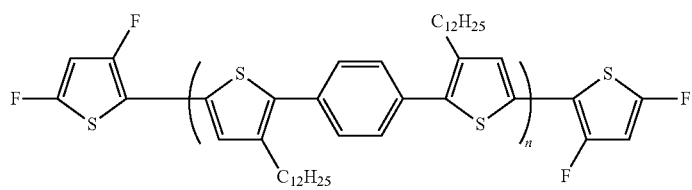
CHEMICAL FORMULA (18)
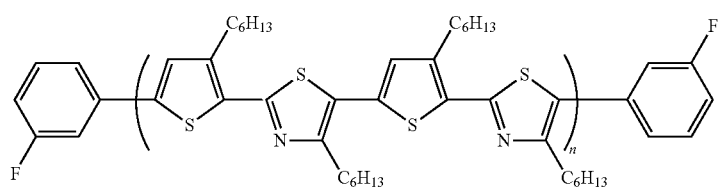
CHEMICAL FORMULA (19)
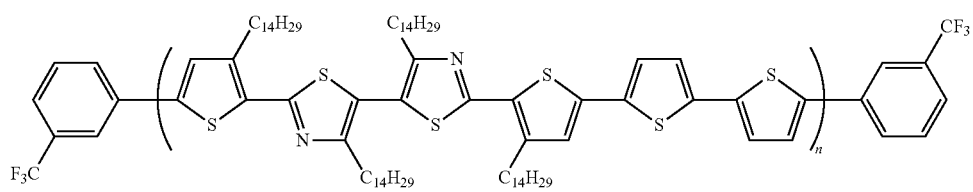
CHEMICAL FORMULA (20)
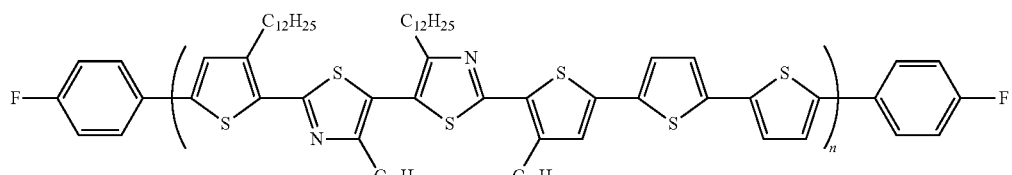
CHEMICAL FORMULA (21)
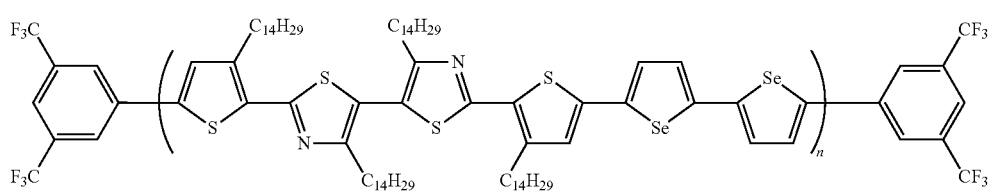
CHEMICAL FORMULA (22)
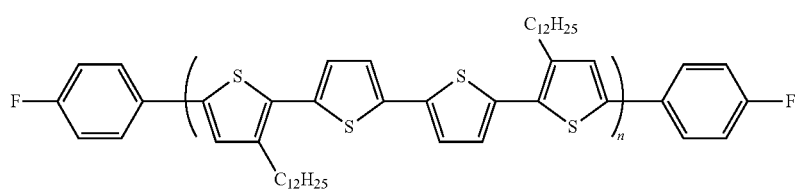
CHEMICAL FORMULA (23)

-continued
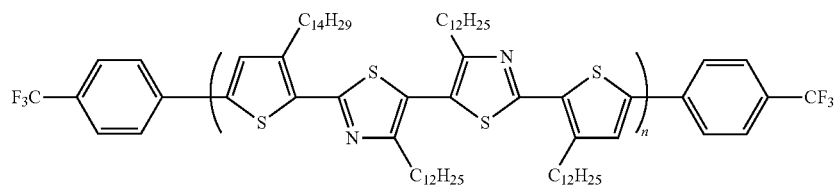
CHEMICAL FORMULA (24)
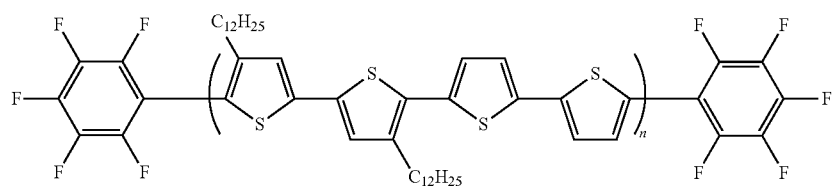
CHEMICAL FORMULA (25)
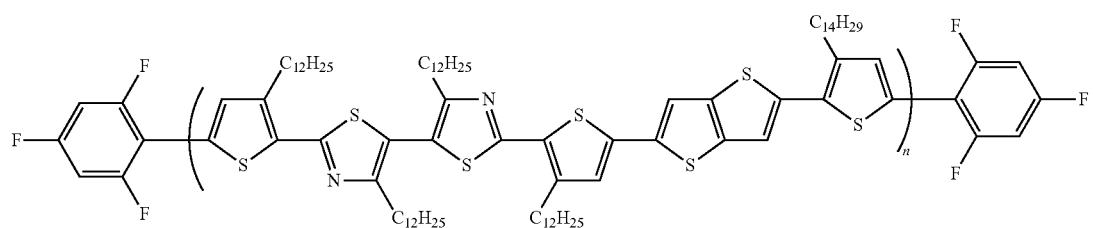
CHEMICAL FORMULA (26)
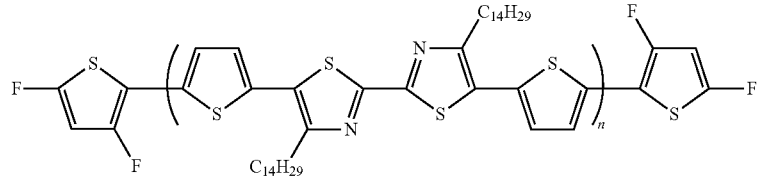
CHEMICAL FORMULA (27)
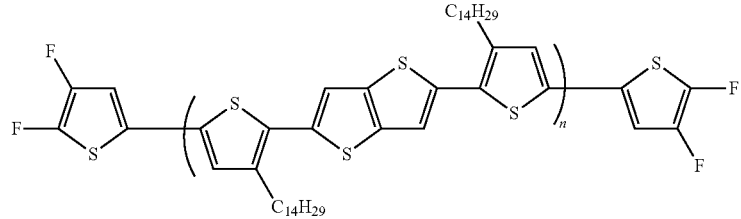
CHEMICAL FORMULA (28)
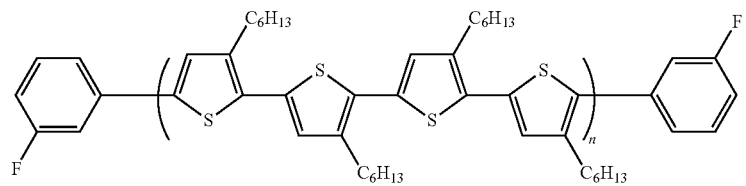
CHEMICAL FORMULA (29)
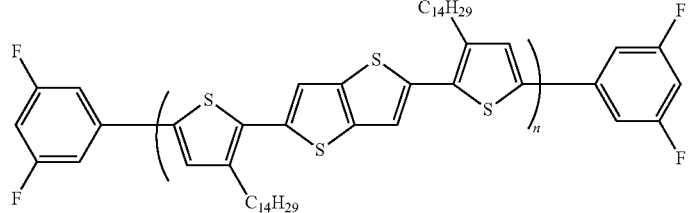
CHEMICAL FORMULA (30)

CHEMICAL FORMULA (31)

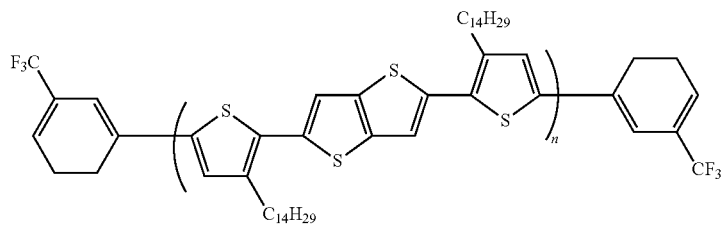

CHEMICAL FORMULA (32)

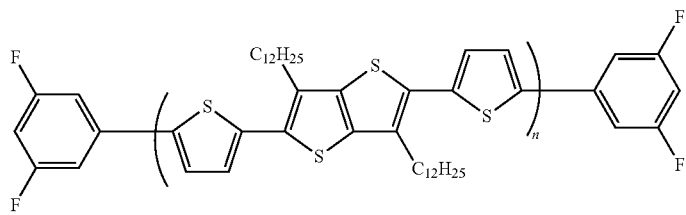

CHEMICAL FORMULA (33)

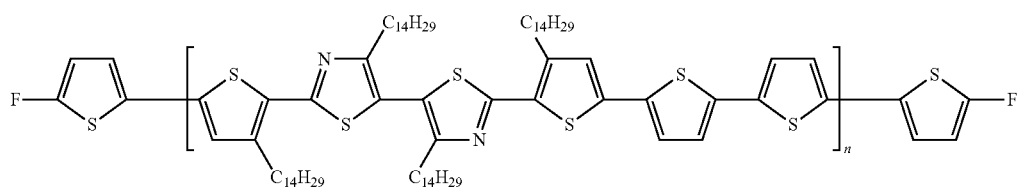

CHEMICAL FORMULA (34)

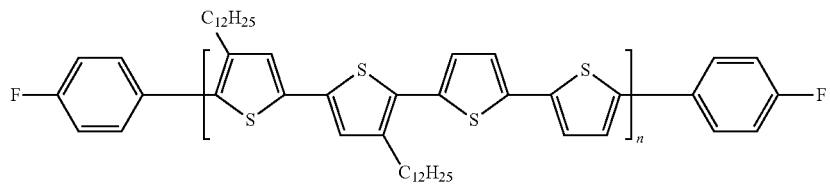

CHEMICAL FORMULA (35)

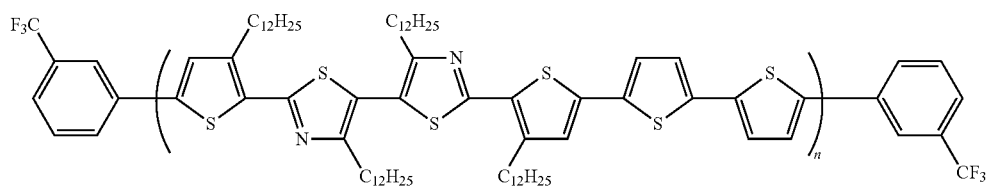

CHEMICAL FORMULA (36)

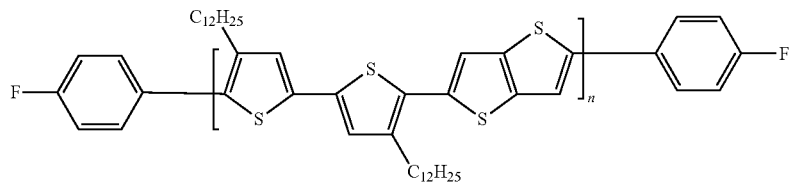

CHEMICAL FORMULA (37)

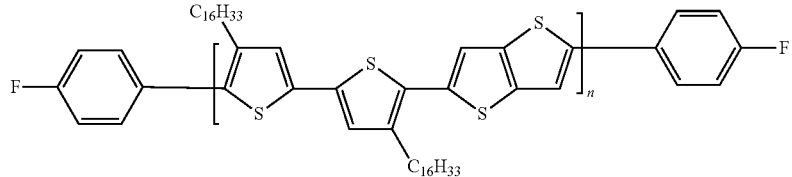

The organic semiconductor polymer represented by Chemical Formula (1) may be synthesized according to methods disclosed in Stille et al. (Angew. Chem. Int. Ed. Engl. 1986, Vol. 25, pp. 508-524), Suzuki et al. (J. Am. Chem. Soc. 1989, Vol. 111, pp. 314-321), McCullough et al. (U.S. Pat. No. 6,166,172, 1999), or Yamamoto et al. (Macromolecules 1992, Vol. 25, pp. 1214-1226). As shown in Reaction Scheme (1), the organic semiconductor polymer may be synthesized by reacting monomer (1A) (which functions as a polymer main chain) with compound (1B) (which functions as a terminal functional group).

REACTION SCHEME (1)

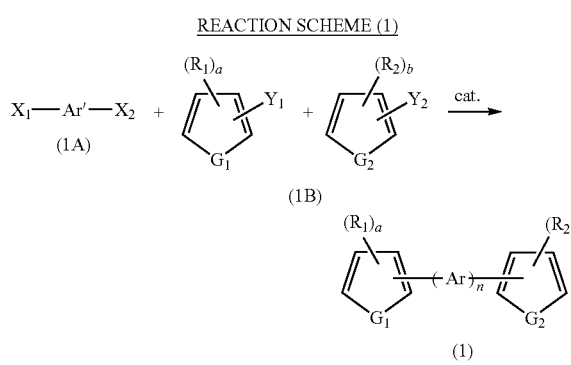

In Reaction Scheme (1), the compound (1B), constituting a terminal functional group, is used in an amount of about 5 to about 10 equivalents with respect to the monomer (1A).

In the Reaction Scheme 1, Ar' is the same as Ar in Chemical Formula (1), and $X_1$, $X_2$, $Y_1$, and $Y_2$ are independently reactive groups selected from the group consisting of a halogen (e.g., Br, I, Cl and other halogen elements) group, a trialkyl tin group and a borane group. However, example embodiments are not limited thereto. $G_1$, $G_2$, $R_1$, $R_2$, Ar, n, a, and b are the same as defined in the above Chemical Formula (1).

The trialkyl tin group may be represented by Chemical Formula (38), shown below, and the borane group may be represented by Chemical Formula (39) or Chemical Formula (40), both shown below.

CHEMICAL FORMULA (38)

In Chemical Formula (38), $R_{31}$ to $R_{33}$ are the same or different, and are independently hydrogen or a C1 to C7 alkyl, provided that at least one of $R_{31}$ to $R_{33}$ is an alkyl.

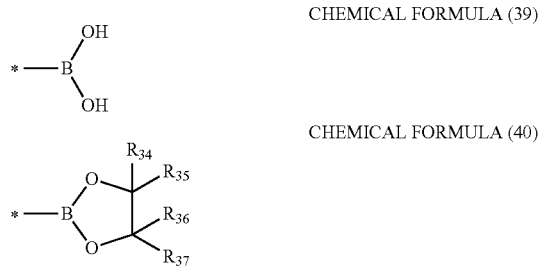
CHEMICAL FORMULA (39)

CHEMICAL FORMULA (40)

In Chemical Formula 40, $R_{34}$ to $R_{37}$ are the same or different, and are independently hydrogen or a C1 to C7 alkyl, provided that at least one of $R_{34}$ to $R_{37}$ is an alkyl.

A catalyst may be used in the reaction of the Reaction Scheme (1), and may be an organic metal catalyst represented by Chemical Formulae (41-1) to (41-4), all of which are shown below.

$Pd(L_1)_x$      CHEMICAL FORMULA (41-1)

$Pd(L_2)_{4-y}Cl_y$      CHEMICAL FORMULA (41-2)

In Chemical Formulae (41-1) and (41-2), $L_1$ and $L_2$ are ligands selected from the group consisting of triphenylphosphine (PPh$_3$), 1,4-bis(diphenylphosphine)butane (dppb), 1,1'-bis(diphenylphosphino)ferrocene (dppf), acetate (OAc), triphenyl arsine (AsPh$_3$) and triphenylphosphite (P(OPh)$_3$), x is an integer ranging from 2 to 4, and y is an integer ranging from 1 to 3.

$Ni(L_3)_x$      CHEMICAL FORMULA (41-3)

$Ni(L_4)_{3-y}Cl_y$      CHEMICAL FORMULA (41-4)

In Chemical Formulae (41-3) and (41-4), $L_3$ and $L_4$ are ligands selected from the group consisting of a bis(diphenylphosphino)alkane (e.g., 1,3-bis(diphenylphosphino)propane (dppp), 1,2-bis(diphenylphosphino)ethane (dppe), 1,4-bis(diphenylphosphino)butane (dppb) and the like) and a cycloalkene (e.g., 1,5-cyclooctadiene (COD) and the like), x is an integer of 2 or 3, and y is an integer of 1 or 2.

Examples of palladium catalysts include a palladium (0) catalyst (e.g., a tetrakis(triphenylphosphine)palladium (0) compound (Pd(PPh$_3$)$_4$)) and palladium (II) catalysts (e.g., bis(triphenylphosphine)palladium(II) dichloride (PdCl$_2$P(Ph$_3$)$_2$), [1,4-bis(diphenylphosphine)butane]palladium (II) dichloride (Pd(dppb)Cl$_2$), [1,1'-bis(diphenylphosphino)ferrocene]palladium (II) dichloride (Pd(dppf)Cl$_2$), palladium (II) acetate (Pd(OAc)$_2$) and the like).

Examples of nickel catalysts include a nickel (0) catalyst (e.g., a bis(1,5-cyclooctadiene) nickel (0) compound (Ni(COD)$_2$)) and a nickel (II) catalyst (e.g., 1,3-diphenylphosphinopropane nickel (II) chloride (Ni(dppp)Cl$_2$), 1,2-bis(diphenylphosphino)ethane nickel (II) chloride (Ni(dppe)Cl$_2$) and the like).

The catalyst may be used by adjusting its amount according to amounts of the monomers. For example, the tetrakis(triphenyl phosphine) palladium (0) compound may be used at about 0.2-mol % to about 15-mol % with respect to monomers or at about 2-mol % to about 10-mol % with respect to monomers. For example, the tetrakis(triphenyl phosphine) palladium (0) compound may be used at about 0.2-mol % to about 10-mol % with respect to monomers, or at about 2-mol % to about 15-mol % with respect to monomers.

A polymerization solvent (e.g., toluene, dimethylformamide (DMF), tetrahydrofuran (THF), N-methylpyrrolidone (NMP) and the like) may be used.

Condensation reaction may be performed at about 80° C. to about 120° C. for about 6-hours to about 48-hours under a nitrogen atmosphere.

The organic semiconductor polymer may be applied to an active layer of a transistor. The transistor may include a gate electrode positioned on a substrate, a source electrode and a drain electrode facing each other and defining a channel region, an insulation layer that electrically insulates the source electrode, the drain electrode and the gate electrode, and an active layer including the organic semiconductor polymer in the channel region.

The active layer may be prepared using a solution process of a composition including an organic semiconductor polymer (e.g., screen printing, printing, spin coating, dipping, inkjetting and similar techniques). If the active layer is obtained by a solution process, the process cost may be reduced, making it useful for fabricating a large area device.

Figure 2:
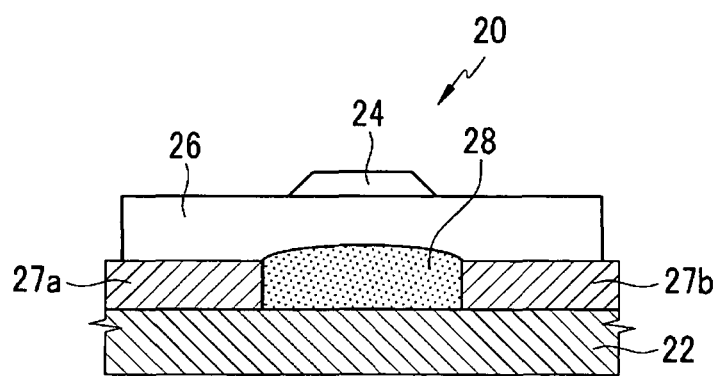

FIG. 1 is a schematic cross-sectional view of a transistor according to example embodiments. FIG. 2 is a schematic cross-sectional view of a transistor according to example embodiments The transistors according to example embodiments may be thin film transistors. The thin film transistors may be a thin film having a thickness of several nanometers (nm) to several micrometers (μm).

Referring to FIG. 1, a transistor 10 includes a substrate 12, a gate electrode 14 disposed on the substrate, and an insulation layer 16 covering the gate electrode 14. On the insulation layer 16, a source electrode 17a and a drain electrode 17b defining a channel region are provided. An active layer 18 may be provided in the channel region. The active layer 18 includes an organic semiconductor polymer.

Referring to FIG. 2, in a transistor 20, a source electrode 27a and a drain electrode 27b defining a channel region are formed on a substrate 22. An active layer 28 may be formed on the channel region. The active layer 28 includes an organic semiconductor polymer. An insulation layer 26 may be formed to cover the source electrode 27a, the drain electrode 27b and the active layer 28. A gate electrode 24 may be formed thereon.

The substrates 12 and 22 may include an inorganic material, an organic material, or a composite of an inorganic material and an organic material. The organic material may include, for example, a plastic (e.g., polyethylene naphthalate (PEN), polyethylene terephthalate (PET), polycarbonate, polyvinylalcohol, polyacrylate, polyimide, polynorbornene and polyethersulfone (PES)) and the inorganic material may include, for example, glass or metal.

The gate electrodes 14 and 24, source electrodes 17a and 27a, and drain electrodes 17b and 27b may include a metal (e.g., gold (Au), silver (Ag), aluminum (Al), nickel (Ni)), indium tin oxide (ITO) or combinations thereof. However, example embodiments are not limited thereto.

The insulation layers 16 and 26 may include an insulator having a high dielectric constant, for example, a ferroelectric insulator (e.g., $Ba_{0.33}Sr_{0.66}TiO_3$ (BST, barium strontium titanate), $Al_2O_3$, $Ta_2O_5$, $La_2O_5$, $Y_2O_3$, $TiO_2$), an inorganic insulator (e.g., $PbZr_{0.33}Ti_{0.66}O_3$ (PZT), $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, silicon nitride, AlON or similar compounds), or an organic insulator (e.g., polyimide, benzocyclobutane (BCB), parylene, polyacrylate, polyvinylalcohol, polyvinyiphenol or similar compounds). However, example embodiments are not limited thereto. Although it is not mentioned above, the inorganic insulator disclosed in U.S. Pat. No. 5,946,551 and the organic insulator disclosed in U.S. Pat. No. 6,232,157 may be used for the insulation layers 16 and 26.

Figure 3:
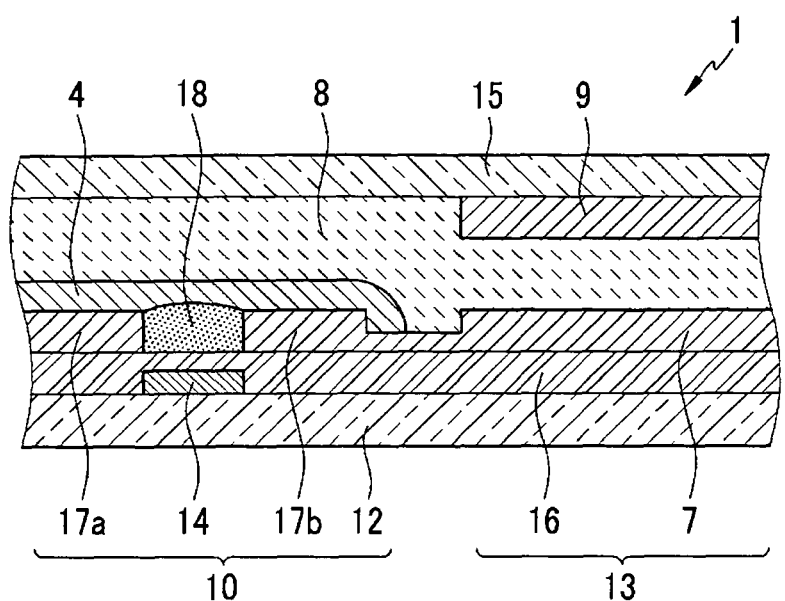

FIG. 3 is a schematic cross-sectional view of a liquid crystal display device including a transistor according to example embodiments Referring to FIG. 3, a semiconductor layer 4 may be formed over a transistor 10. A drain electrode 17b of the transistor 10 may be connected to an electrode 7. A liquid crystal layer 8 may be formed on the semiconductor layer 4 and the electrode 7. A transparent electrode 9 may be formed over the electrode 7. A glass plate 15 may be formed over the transparent electrode 9 and the liquid crystal layer 8. The electrode 7, the liquid crystal layer 8, the transparent electrode 9, and the glass plate 15 collectively form a liquid crystal display portion 13.

The transistor 10 and the liquid crystal display portion 13 collectively form a liquid crystal display device 1.

The materials used to form the liquid crystal display portion 13 (including the semiconductor layer 4, the electrode 7, the liquid crystal layer 8, the transparent electrode 9 and the glass plate 15) may be selected from materials well-known in the semiconductor art.

Although FIG. 3 depicts a liquid crystal display device including a transistor wherein the active layer 18 includes an organic semiconductor polymer according to example embodiments, the organic semiconductor polymers are applicable to any electronic device. The electronic device may be, for example, a memory device, an organic light emitting diode (OLED), an electronic paper (e-paper), a radio-frequency identification (RFID) tag, a flat-panel display including an active-matrix flat-panel display (AMFPD), or a sensor including a photosensor, a biosensor, a chemical sensor or combinations thereof (e.g., a biochemical sensor, photochemical sensor, etc.), a laser device, a photovoltaic device (e.g., a solar cell) and similar devices.

Hereinafter, this disclosure is illustrated in more detail with reference to examples. However, they are example embodiments of this disclosure and are not limiting.

EXAMPLES

Example 1

Example 1-1

Monomer Synthesis

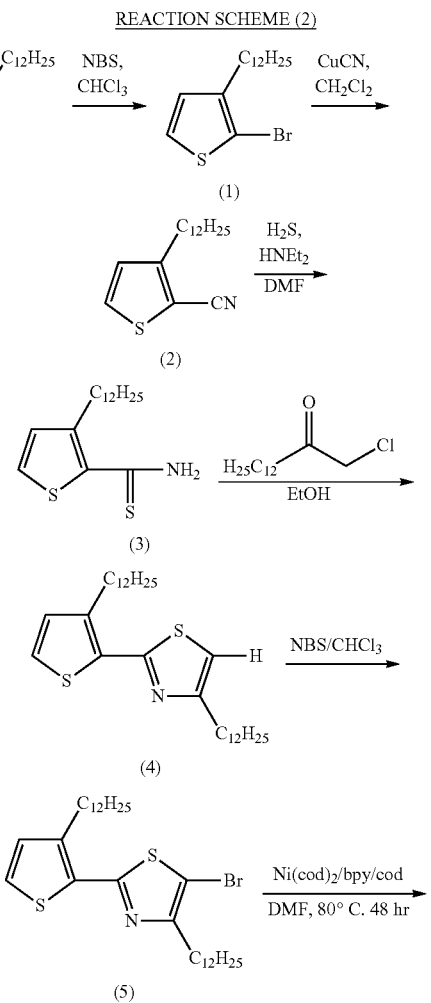

REACTION SCHEME (2)

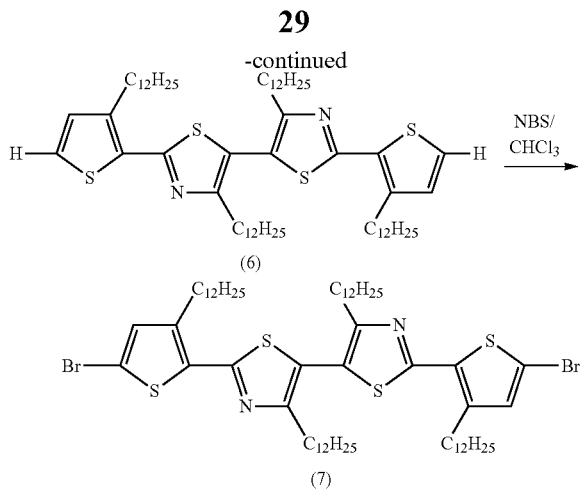

As shown in Reaction Scheme (2), 2-bromo-3-dodecylthiophene (compound (1), 19.0-g, 57.5-mmol) is reacted with an excessive amount (10.3-g, 115.0-mmol) of copper cyanide (CuCN) to provide 2-cyano-3-dodecylthiophene (compound (2), yield: 71%). The obtained 2-cyano-3-dodecylthiophene and a small amount (about 0.1 equivalents) of diethylamine are dissolved in dimethylformamide (DMF), and then bubbled with $H_2S$ gas at −70° C. for about 40 minutes. The mixture is heated and reacted at about 60° C. for 2 hours. Then, the mixture is extracted with ethylacetate and water 2 or 3 times, and washed and dried to provide 2-thiocarbamyl-3-dodecylthiophene (compound (3), yield: 88%, $^1$H NMR (300 MHz, CDCl3) δ 0.88 (t, 3H), 1.25 (m, 18H), 1.67 (m, 2H), 2.91 (t, 2H), 6.95 (d, 1H), 7.36 (d, 1H)). Compound (3) (13.5-g, 43.3-mmol) is reacted with an ethanol solution of 1.2 equivalents of 1-chloro-2-butadecanon at 85° C. for 12 hours to provide 2-thiazole (3'-dodecyl)-3-dodecylthiophene (compound (4), yield: 95%, $^1$H NMR (300 MHz, CDCl3) δ 0.88 (t, 6H), 1.25 (m, 36H), 1.66 (m, 4H), 2.78 (t, 2H), 2.89 (t, 2H), 6.84 (s, 1H), 6.93 (d, 1H), 7.24 (d, 1H)). The 2-thiazole (3'-dodecyl)-3-dodecylthiophene (compound (4)) is reacted with NBS (N-bromosuccinimide) to provide a thiophene-thiazole derivative (compound (5), yield: 91%, $^1$H NMR (300 MHz, CDCl3) δ 0.88 (t, 6H), 1.25 (m, 20H), 1.63 (m, 4H), 2.74 (t, 2H), 2.84 (t, 2H), 6.92 (d, 1H), 7.27 (d, 1H)).

A nickel (0) compound $(Ni(cod)_2$, 1.044-g, 3.8-mmol), bipyridine (bpy, 0.59-g, 3.8-mmol), and cyclo-octadiene (0.45-g) are introduced into anhydrous DMF (10-mL) in a reactor under a nitrogen atmosphere and stirred at 60° C. for 30 minutes. The compound (5) (1.10-g, 1.9-mmol) is added thereto and stirred at about 80° C. to 90° C. for about 48 hours. After the reaction, the reaction solution is added to an ammonia water/methanol (½, ca. 1.2-L) mixed solution at room temperature and stirred for 12 hours to complete the reaction. Then, the mixture is filtered under reduced pressure. The obtained reactant is dissolved in toluene and re-precipitated in methanol several times and dried at 60° C. for about 24 hours to provide a product of a thiazole-thiophene tetramer (compound (6), yield=68%, $^1$H NMR (300 MHz, CDCl3) δ 0.86 (t, 6H), 1.32 (m, 20H), 1.69 (m, 4H), 2.68 (t, 2H), 2.92 (t, 2H), 6.96 (d, 1H), 7.28 (d, 1H)). The obtained thiazole-thiophene tetramer is reacted with NBS (N-bromosuccinimide) in a chloroform solution to provide a thiazole-included compound (7) (yield=76%, $^1$H NMR (300 MHz, CDCl3) δ0.89 (t, 12H), 1.25 (m, 72H), 1.68 (m, 8H), 2.67 (t, 4H), 2.85 (t, 4H), 6.94 (s, 2H)). FT-IR (KBr, cm$^{-1}$) 2920, 2846, 1541, 1446, 1394, 1386, 1253, 1232, 1024, 964, 883, 844, 825, 721, 594.

Example 1-2

Polymer Synthesis (Chemical Formula 21)

REACTION SCHEME (3)

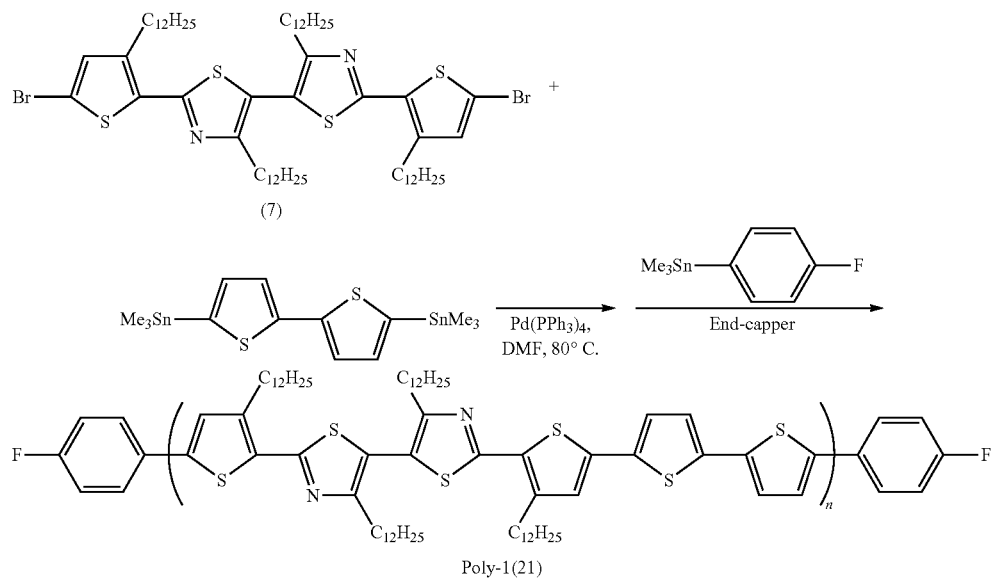

Poly-1(21)

The thiazole-included compound (7) (0.5-g, 0.43-mmol, 1.0 equivalent) obtained from Example 1-1 and bis(trimethylstannyl)thiophene obtained from the method disclosed in Pham et al. (J. Org. Chem., 1984, Vol. 49, 5250, 0.16 g, 0.32 mmol, 0.7 equivalents) are introduced into a reactor under the nitrogen atmosphere and completely dissolved in anhydrous DMF with slight heating. Then, a polymerization catalyst of tetrakis(triphenylphosphine) palladium (0) (Pd(PPh$_3$)$_4$)) (39- mg, 10-mol % relative to compound (7)) is added thereto and reacted at 85° C. for 5 hours to 6 hours. An excessive amount (1.1-g, 4.3-mmol) of 4-trimethylstannyl-fluorobenzene relative to compound (7) is added thereto and reacted for about 24 hours. After the reaction, the mixed reaction solution that has cooled to room temperature is filtered. The obtained polymer solid is washed with hydrochloric acid aqueous solution/chloroform two times, with ammonia aqueous solution/chloroform two times, and with water/chloroform two times, and then the washed polymer solid is subjected to a Soxhlet extraction using methanol, acetone, methylene chloride and chloroform to obtain a polymer. It is dried to provide a dark blue polymer of Poly-1 represented by Chemical Formula (21) (yield=47%).

$^1$H NMR (300 MHz, CDCl3) δ 0.89 (—CH3), 1.24 (—(CH2)9-), 1.45 (—CH2-), 1.74 (—CH2-), 2.71 (Aromatic-CH2-), 2.89 (Aromatic-CH2-), 7.05, 7.12, 7.17, 7.61 (—C6H4-F), $^{19}$F NMR (300 MHz, CDCl3) δ −114.5 (Ph-F)

CHEMICAL FORMULA (21)

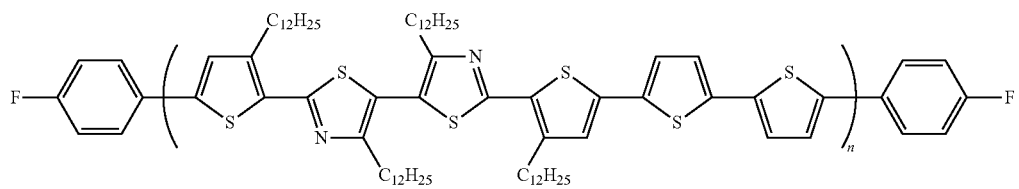

In Chemical Formula (21), the number average molecular weight measured by GPC (gel permeation chromatography) is 20,000, and n indicates a polymerization degree.

Comparative Example 1

A dark blue polymer of Poly-1A represented by the following Chemical Formula (21A) is synthesized (yield=62%) in accordance with the same procedure as in Example 1, except that the 2-tributylstannyl-thiophene is used as an endcapper instead of 4-trimethylstannyl-fluorobenzene in Example 1-2.

CHEMICAL FORMULA (21A)

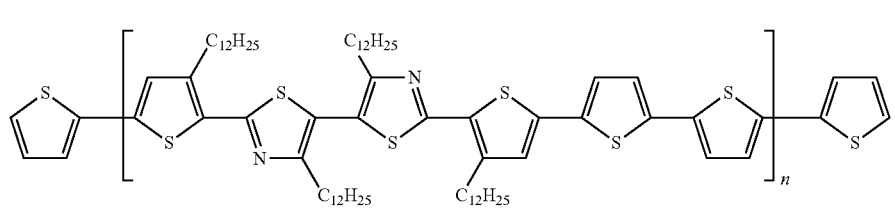

In Chemical Formula (21A), the number average molecular weight is 28,000, and n indicates a polymerization degree.

$^1$H NMR (300 MHz, CDCl3) δ0.88 (12H, —CH3), 1.28 (72H, —CH29-), 1.74 (4H, —CH2-), 2.71 (4H, Thiophene-CH2-), 2.87 (4H, Thiazole-CH2-), 7.06 (2H, Dodecylthiophene-H), 7.12 (2H, Bithiophene-H), 7.18 (2H, Bithiophene-H). FT IR (KBr, cm−1) 3066, 2920, 2850, 1556, 1460, 1406, 1377, 1246, 1217, 1029, 817, 779, 721.

Figure 4:
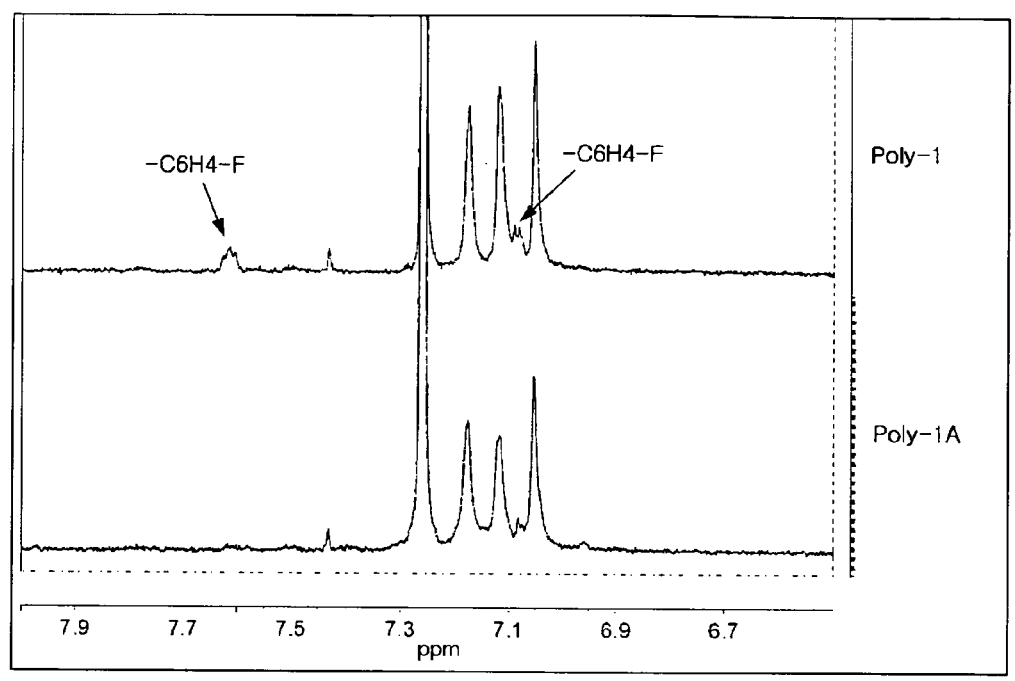
Figure 5:
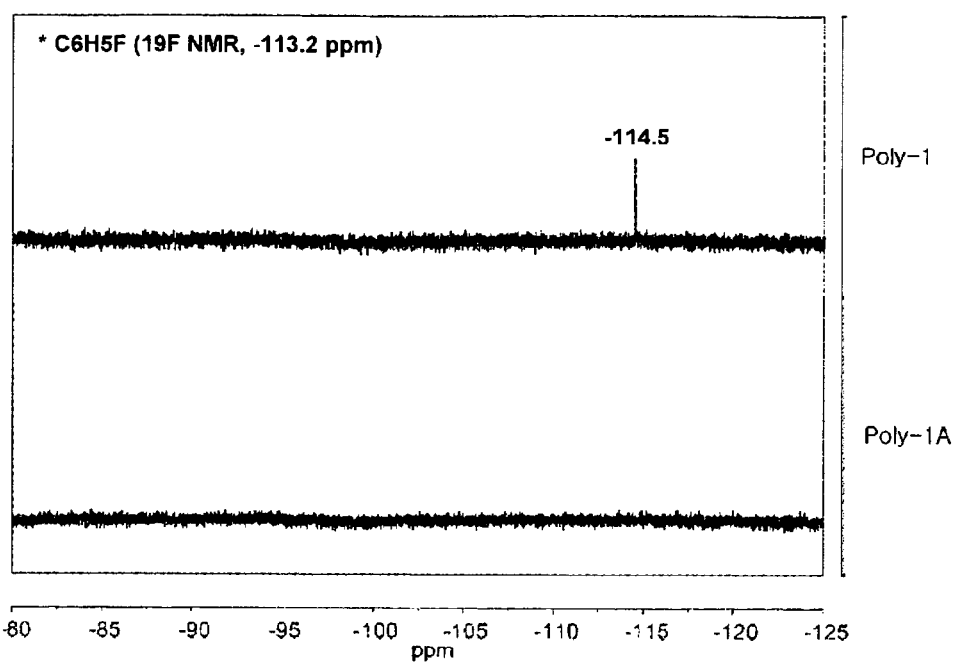

FIG. 4 shows $^1$H NMR spectra of the Poly-1 polymer (i.e., the polymer having Chemical Formula (21)) according to Example 1 and the Poly-1A polymer (i.e., the polymer having Chemical Formula (21A)) according to Comparative Example 1. FIG. 5 shows $^{19}$F NMR spectra of the Poly-1 polymer (i.e.; the polymer having Chemical Formula (21)) according to Example 1 and the Poly-1A polymer (i.e., the polymer having Chemical Formula (21A)) according to Comparative Example 1.

It is confirmed that the Poly-1 polymer obtained in Example 1 has a terminal functional group of fluorophenyl (—$C_6H_4F$) group as shown in FIG. 4 and FIG. 5.

Example 2

Polymer Synthesis (Chemical Formula 33)

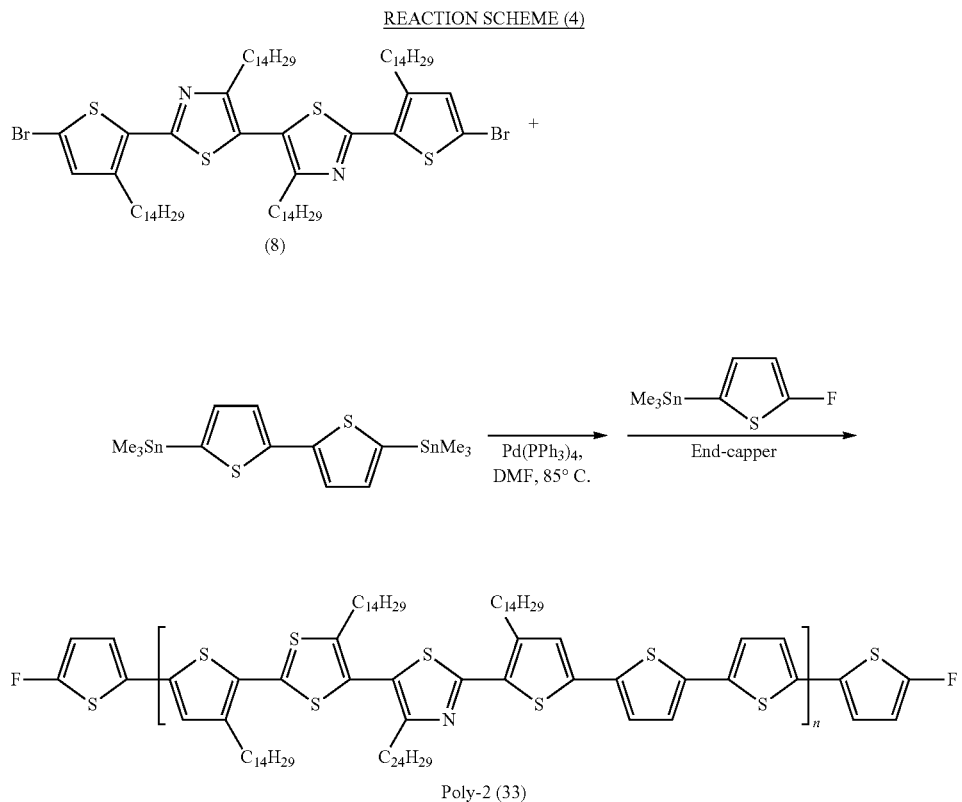

The thiazole-included compound (8) (0.25-g, 0.2-mmol, 1.0 equivalent) and bis(trimethylstannyl)thiophene (0.07-g, 0.15-mmol) obtained from the method disclosed in Pham et al. (J. Org. Chem., 1984, Vol. 49, p. 5250) are introduced into a reactor under the nitrogen atmosphere and completely dissolved in anhydrous DMF with slight heating. Then, a polymerization catalyst of tetrakis(triphenylphosphine) palladium (0) ($Pd(PPh_3)_4$)) (23-mg, 10-mol % relative to the compound (8)) is added thereto and reacted at 85° C. for 5 hours to 6 hours. An excessive amount (0.5-g, 2.0-mmol) of 4-trimethylstannyl-fluorothiophene is added thereto and reacted for about 24 hours. After the reaction, the mixed reaction solution that has cooled to room temperature is filtered. The obtained polymer solid is washed and purified according to the same procedure as in Example 1-2 to provide a dark red polymer of Poly-2 represented by Chemical Formula (33) (yield=45%).

Figure 6:
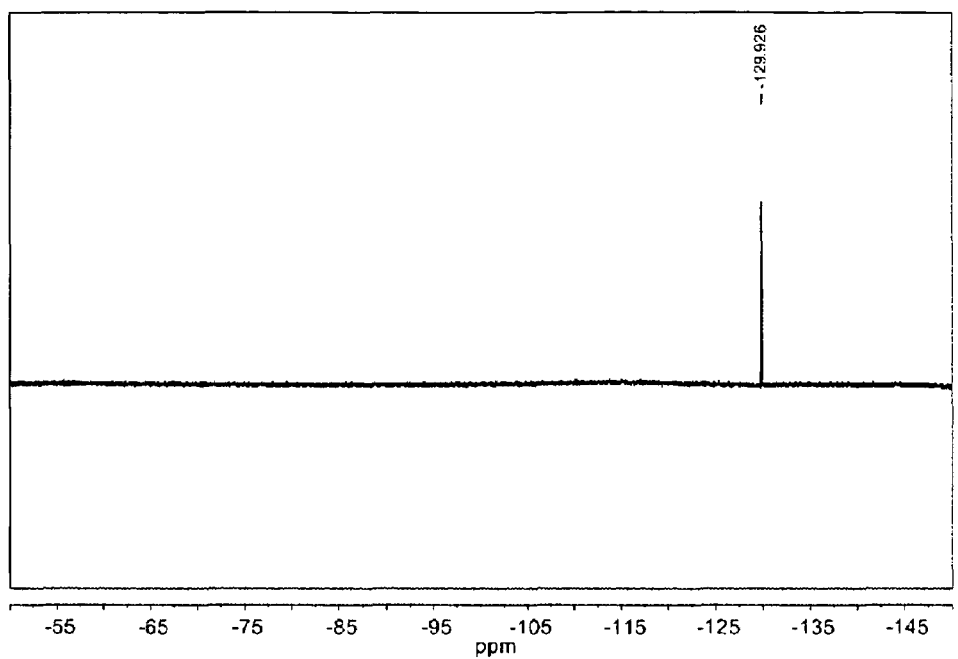

$^1$H NMR (300 MHz, $CDCl_3$) δ 0.89 (—$CH_3$), 1.27 (—$(CH_2)_{11}$-), 1.45 (—$CH_2$-), 1.74 (—$CH_2$-), 2.72 (Aromatic-$CH_2$-), 2.90 (Aromatic-$CH_2$-), 7.05, 7.12, 7.17, 7.61 (—$C_6H_4$-F), $^{19}$F NMR (300 MHz, $CDCl_3$) δ −129.93 (Th—F) (FIG. 6)

CHEMICAL FORMULA (33)

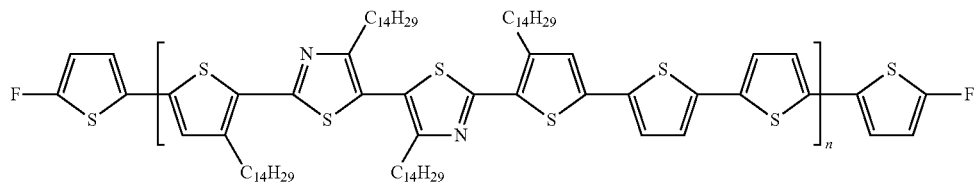

In Chemical Formula (33), the number average molecular weight measured by GPC (gel permeation chromatography) is 20,000, and n indicates a polymerization degree.

FIG. 6 shows a $^{19}$F NMR spectrum of the Poly-2 according to Example 2.

It is confirmed that the Poly-2 polymer obtained in Example 2 has a terminal functional group of fluorothiophenyl group as shown in FIG. 6.

Example 3

Polymer Synthesis (Chemical Formula 34)

REACTION SCHEME (5)

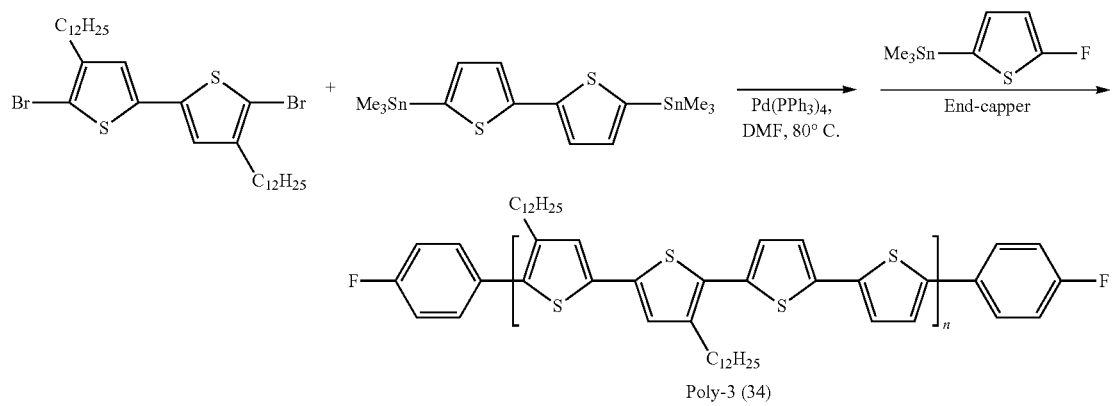

Poly-3 (34)

A dark red solid polymer of Poly-3 represented by the following Chemical Formula (34) is synthesized in accordance with the same procedure as in Example 1-2, except that the 5,5'-dibromo-4,4'-bis(dodecyl)-2,2'dithiophene is used as a comonomer instead of dibromo(thiophene-thiazole)tetramer in Example 1-2 (yield=38%).

CHEMICAL FORMULA (34)

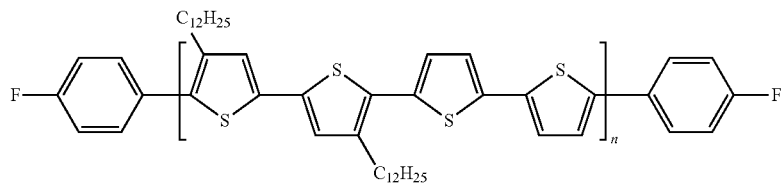

In Chemical Formula (34), the number average molecular weight measured by GPC (gel permeation chromatography) is 25,000, and n indicates a polymerization degree.

Example 4

Polymer Synthesis (Chemical Formula 35)

REACTION SCHEME (6)

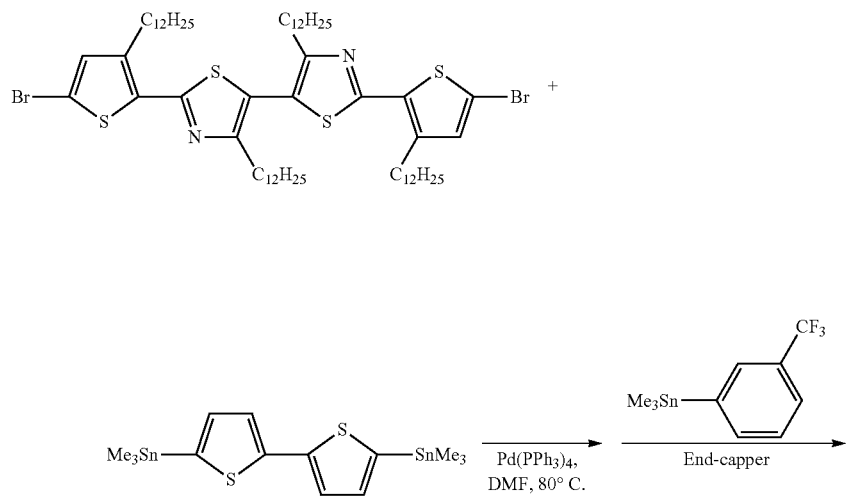

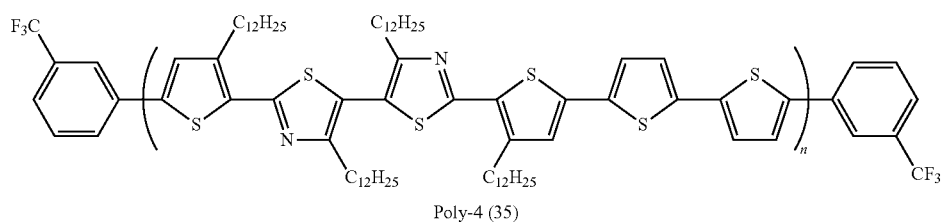

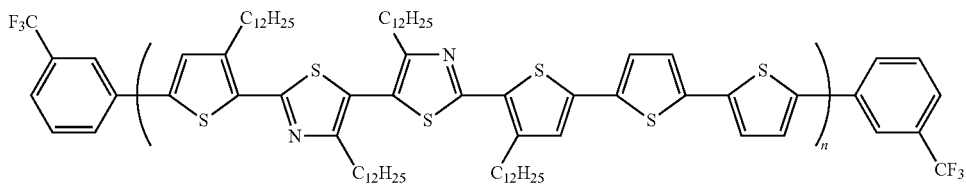

Poly-4 (35)

A dark red polymer of Poly-4 represented by the following Chemical Formula (35) is synthesized (yield=41%) in accordance with the same procedure as in Example 1-2, except that the 3-trimethylstannyl-1-trifluoromethylbenzene is used as an end-capper instead of 4-trimethylstannyl-fluorobenzne in Example 1-2.

$^1$H NMR (300 MHz, CDCl3) δ 0.85 (—CH3), 1.24 (—(CH2)9-), 1.46 (—CH2-), 1.74 (—CH2-), 2.72 (Aromatic-CH2-), 2.89 (Aromatic-CH2-), 7.05, 7.11, 7.17, 7.33, 7.54, 7.89 (—C6H4-CF3), $^{19}$F NMR (300 MHz, CDCl3) δ −63.8 (Ph-CF3)

CHEMICAL FORMULA (35)

In Chemical Formula (35), the number average molecular weight measured by GPC (gel permeation chromatography) is 41,000, and n indicates a polymerization degree.

Example 5

Polymer Synthesis (Chemical Formula 36)

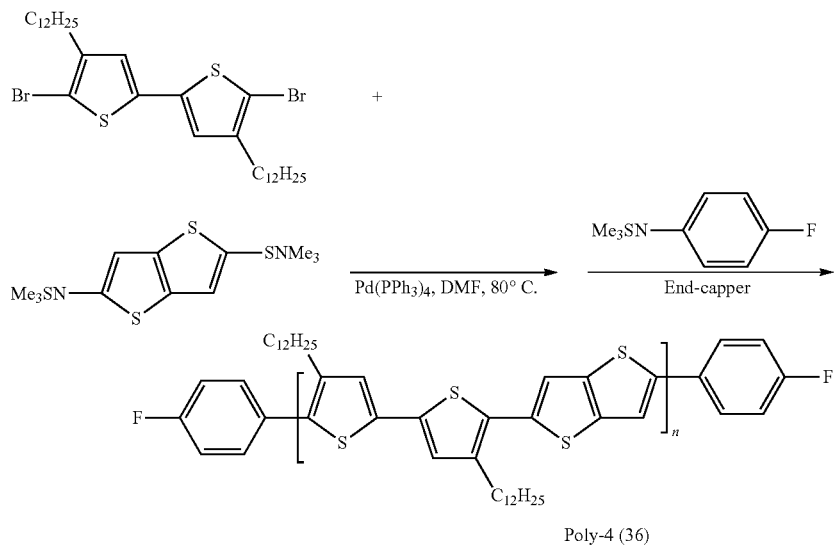

Poly-4 (36)

5,5'-DIIBROMO-4,4'-bis(dodecyl)-2,2'dithiophene (0.075-g, 0.25-mmol, 1.0 equivalent) and bis(trimethylstannyl)thiophene (0.19 g. 0.225 mmol, 0.9 equivalents) obtained from the method disclosed in Pham el al. (J. Org. Chem, 1984, Vol. 49, p. 5250) are introduced into a reactor under the nitrogen atmosphere and completely dissolved in anhydrous DMF with slight heating. Then, a polymerization catalyst of tetrakis(triphenylphosphine) palladium (0) (Pd(PPh$_3$)$_4$)) (25-mg, 1.0 mol % relative to 5,5'-dibromo-4,4'-bis(dodecyl)-2,2'dithiophene) is added thereto and reacted at 85° C. for 5 hours to 6 hours. An excessive amount (0.58-g, 2.25-mmol) of 4-trimethylstannyl-fluorophenyl relative to 5,5'-dibromo-4,4'-bis(dodecyl)-2,2'dithiophene is added thereto and reacted for about 24 hours. After the reaction, the mixed reaction solution that has cooled to room temperature is filtered. The obtained polymer solid is washed and purified according to the same procedure as in Example 1-2 to provide a dark red polymer of Poly-5 represented by Chemical Formula (36) (yield=35%).

CHEMICAL FORMULA (36)

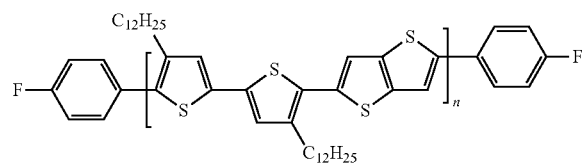

In Chemical Formula (36), the number average molecular weight measured by GPC (gel permeation chromatography) is 18,000, and n indicates a polymerization degree.

Example 6

Manufacturing Organic Thin Film Transistor (OTFT)

A gate electrode 14 of chromium is deposited at 1000-Å on a cleaned glass substrate 12 by sputtering, and an insulation layer 16 of SiO$_2$ is deposited thereon at 3000-Å by a CVD method. Gold (Au) is deposited at 700-Å thereon by sputtering to provide a source electrode 17*a* and a drain electrode 17*b*. The glass substrate 12 is washed for 10 minutes using isopropyl alcohol, and dried before coating the organic semiconductor material. The insulation layer of SiO$_2$ is treated with UV/O$_3$ for 30 minutes before the surface modification. The device is dipped in octyltrichloro silane solution that is diluted in n-hexane at a concentration of 10-mM for 30 minutes, and the device is washed with hexane and alcohol and dried. The Poly-1 polymer represented by Chemical Formula (21) obtained from Example 1 is dissolved in chlorobenzene to a concentration of 1.0-wt % and coated on the device by spin-coating, and then baked at 150° C. for one hour under the nitrogen atmosphere to provide an active layer 18, forming an OTFT device 10 having a structure shown in FIG. 1.

Comparative Example 2

Manufacturing Organic Thin Film Transistor (OTFT)

An OTFT device 10 is manufactured in accordance with the same procedure as in Example 6, except that the active layer 18 includes the organic semiconductor polymer represented by Chemical Formula (21A) obtained from Comparative Example 1.

Electrical Stability Comparison

The OTFT device according to Example 6 is applied with a bias voltage (VGS=−20V, VDS=−0.1V) using a semiconductor characterization system (4200-SCS) manufactured by KEITHLEY to determine on-state current transfer characteristics of the OTFT device. The results are shown in FIG. 7.

Figure 7:
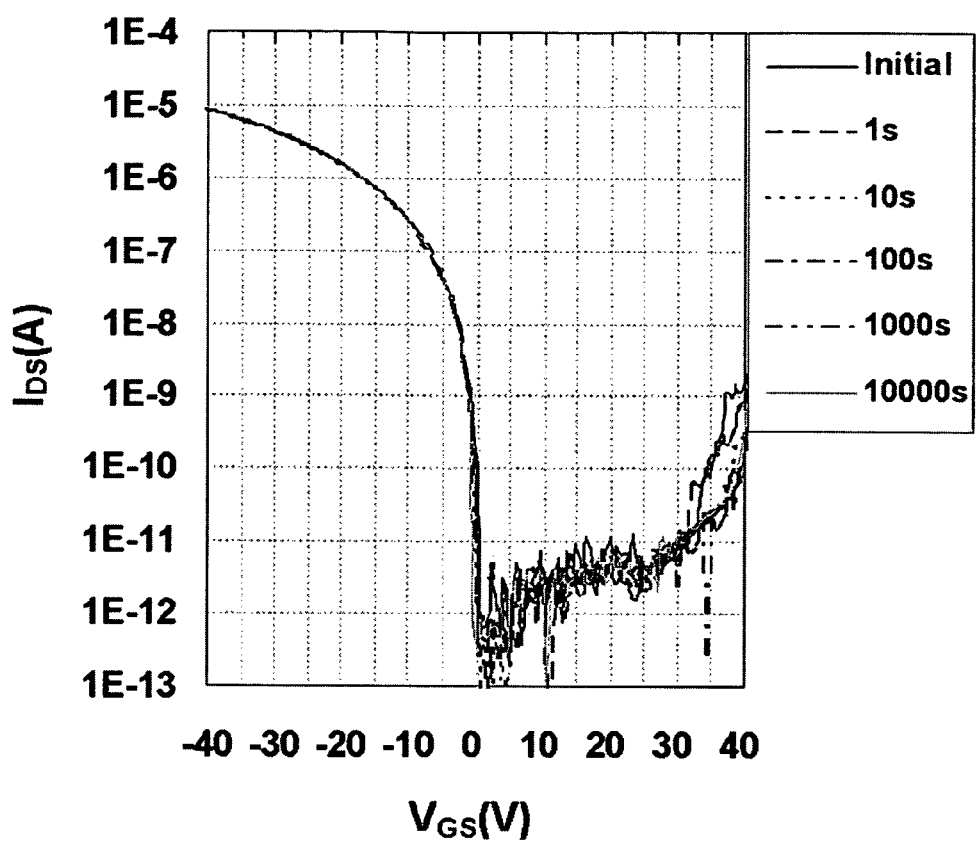
Figure 8:
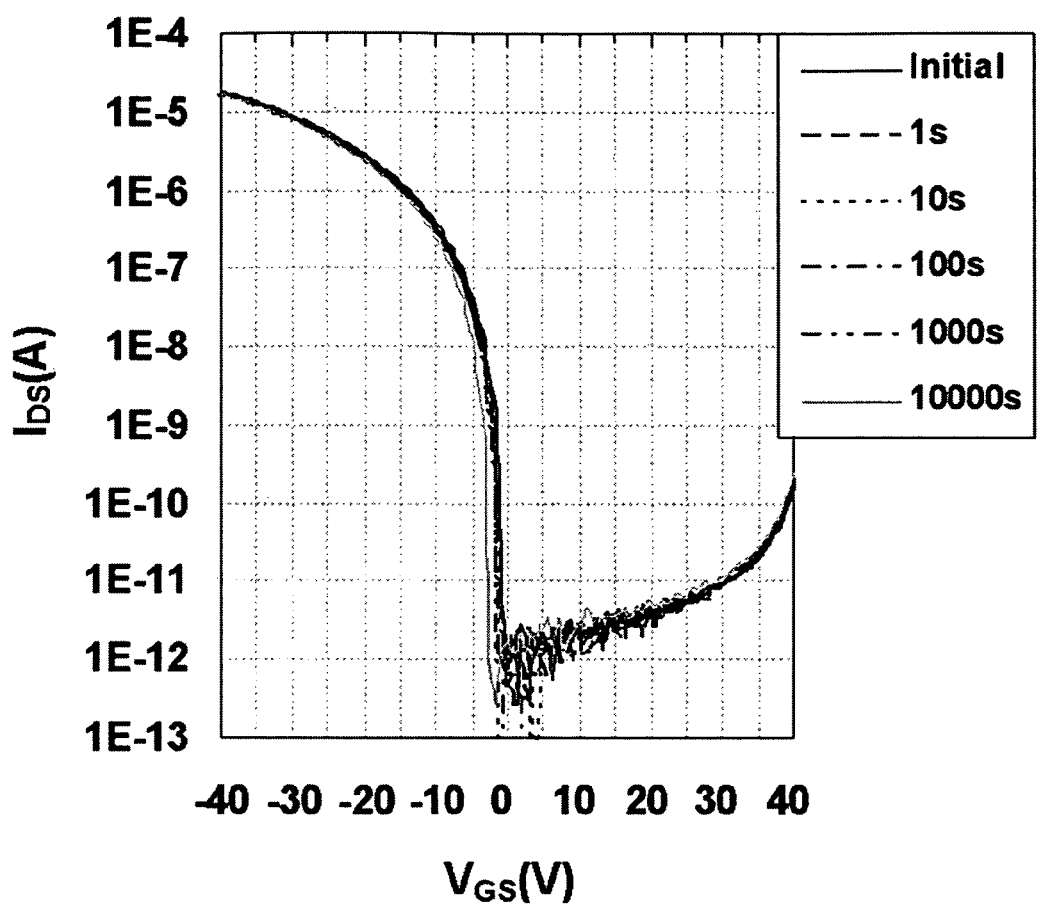

FIG. 7 shows that the device has increased electrical stability with a voltage difference (ΔVth) of 2V or less. The OTFT device according to Comparative Example 2 shows similar characteristics (3V or less) thereto (FIG. 8).

Figure 9:
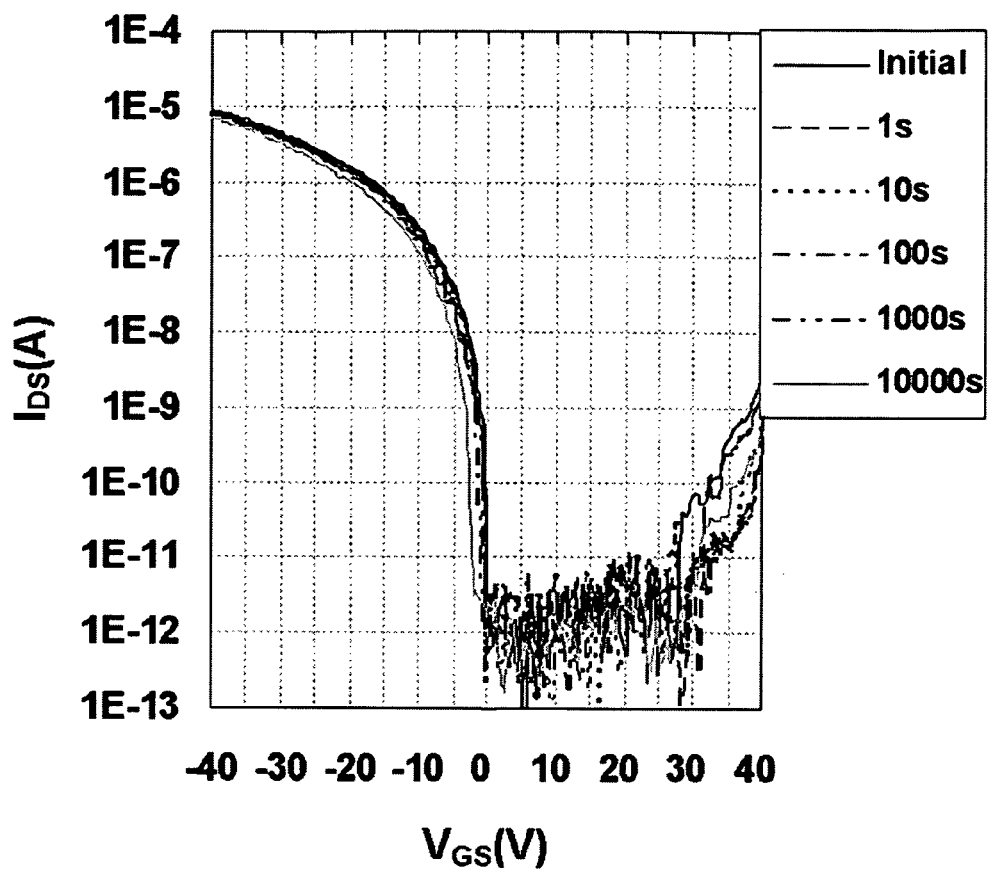
Figure 10:
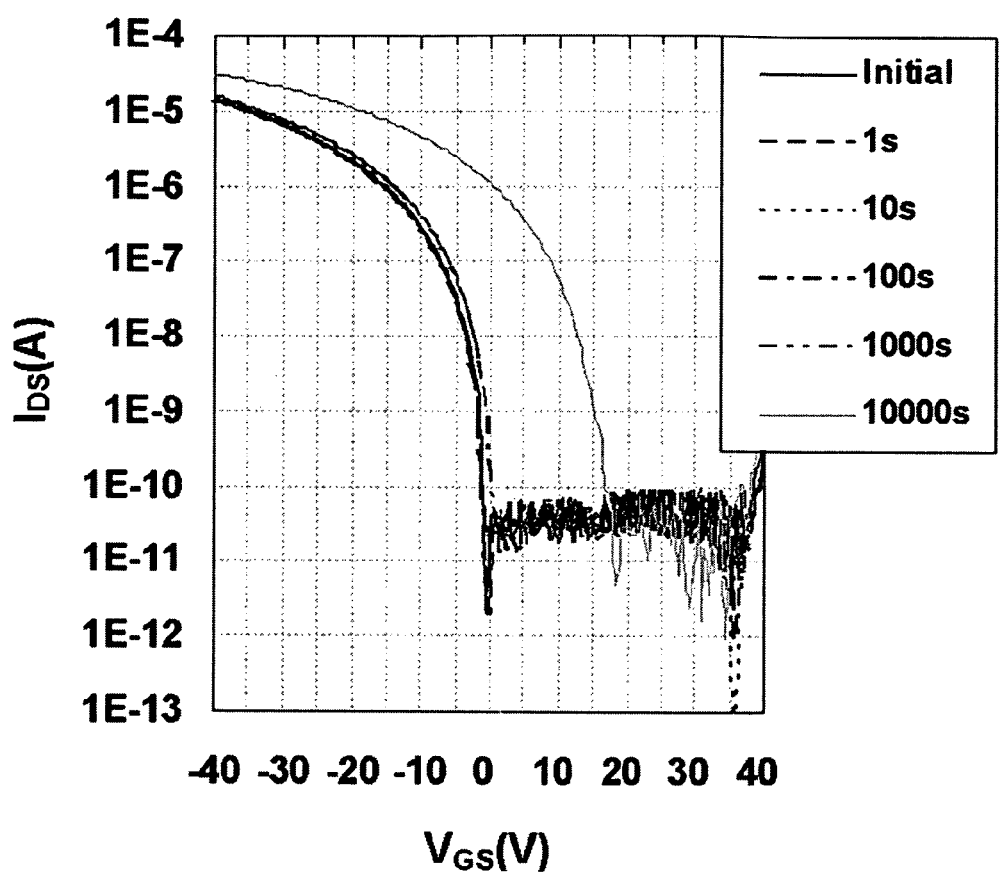

The OTFT devices according to Example 6 and Comparative Example 2 are applied with a bias voltage (VGS=+20V, VDS=−10V), respectively, in the air (RH=12%) using a semiconductor characterization system (4200-SCS) manufactured by KEITHLEY to determine off-state current transfer characteristics of the OTFT devices. The results are shown in FIGS. 9 and 10, respectively. As shown in FIG. 9, the OTFT device according to Example 6 has high stability with a voltage difference (Δ Vth) of 3V or less, but as shown in FIG. 10, the OTFT device according to Comparative Example 2 has low stability with a voltage difference (Δ Vth) of about 20V.

Figure 11:
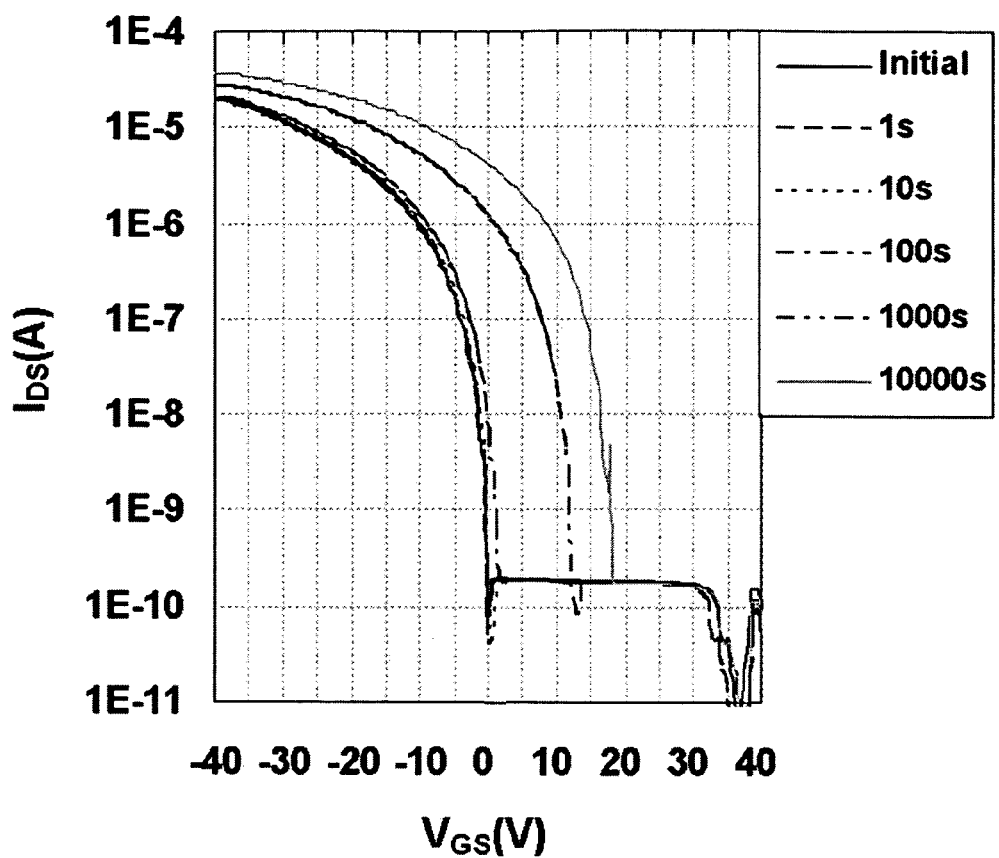
FIG. 11 is a graph showing results of off-state current transfer characteristics in a nitrogen atmosphere of the organic thin film transistor (OTFT) device according to Comparative Example 2.

In order to determine whether the current transfer characteristics of the OTFT device according to Comparative Example 2 are caused by the exterior atmosphere of water or oxygen or by the inherent characteristics of the semiconductor material, the OTFT device according to Comparative Example 2 is measured for off-state current transfer characteristics under a nitrogen atmosphere. The OTFT device according to Comparative Example 2 is applied with a bias voltage (VGS=+20V, VDS=−10V) to determine off-state current transfer characteristics of the OTFT device. The results are shown in FIG. 11. FIG. 11 shows that the OTFT device has low stability with a voltage difference (ΔVth) of about 20V, similar to that measured in the air. From the results of FIG. 11, it is considered that the voltage difference of about 20V of the OTFT device is determined by the inherent characteristics of the semiconductor material.

The organic semiconductor polymers according to example embodiments are capped on the ends by a fluorine-containing group to increase electrical and ambient air stability, and/or charge mobility. The organic semiconductor polymers include a thiophene moiety. The organic semiconductor polymers may be applied to a channel region of a thin film transistor (TFT).

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments are to be understood to be exemplary but not limiting this disclosure in any way.

What is claimed is:

1. An organic semiconductor polymer represented by following Chemical Formula (1):

CHEMICAL FORMULA (1)

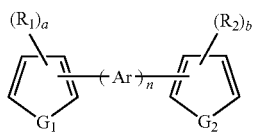

wherein, in the Chemical Formula (1), $G_1$ and $G_2$ are the same or different and are independently selected from the group consisting of —O—, —S—, —Se—, and —CR$_9$=N—, where R$_9$ is one selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof, $R_1$ and $R_2$ are the same or different and are independently selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof, Ar is a substituted or unsubstituted C6 to C30 aromatic ring, or a substituted or unsubstituted C6 to C30 condensed polycycle, n is a polymerization degree and an integer of 8 or more, and a and b are independently integers ranging from 1 to 3, provided that if $G_1$ and $G_2$ are —O—, —S—, or —Se—, then at least one of $R_1$ and $R_2$ is a fluoro or a C1 to C20 perfluoroalkyl, and provided that if $G_1$ and $G_2$ are —CR$_9$=N—, at least one of $R_1$, $R_2$ and $R_9$ is a fluoro or a C1 to C20 perfluoroalkyl.

2. The organic semiconductor polymer of claim 1, wherein $R_9$ is one selected from the group consisting of the fluoro, the C1 to C20 partially fluorinated fluoroalkyl, the C1 to C20 perfluoroalkyl ($C_nF_{2n+1}$) and combinations thereof.

3. The organic semiconductor polymer of claim 1, wherein $R_1$ and $R_2$ are the same or different and are independently selected from the group consisting of the fluoro, the C1 to C20 partially fluorinated fluoroalkyl, the C1 to C20 perfluoroalkyl ($C_nF_{2n+1}$) and combinations thereof.

4. The organic semiconductor polymer of claim 1, wherein $R_9$ is one selected from the group consisting of the fluoro, the C1 to C20 partially fluorinated fluoroalkyl, the C1 to C20 perfluoroalkyl ($C_nF_{2n+1}$) and combinations thereof, and $R_1$ and $R_2$ are the same or different and are independently selected from the group consisting of the fluoro, the C1 to C20 partially fluorinated fluoroalkyl, the C1 to C20 perfluoroalkyl ($C_nF_{2n+1}$) and combinations thereof.

5. The organic semiconductor polymer of claim 1, wherein the organic semiconductor polymer is a p-type polymer.

6. The organic semiconductor polymer of claim 1, wherein Ar includes at least one thiophene moiety.

7. The organic semiconductor polymer of claim 1, wherein Ar is represented by following Chemical Formula (2):

CHEMICAL FORMULA (2)

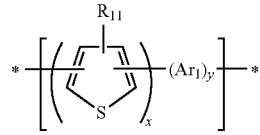

wherein, in the Chemical Formula (2), $R_{11}$ is hydrogen or a C1 to C20 alkyl, $Ar_1$ is selected from the group consisting of a C6 to C30 arylene, a C6 to C30 condensed polycycle, and combinations thereof, x is an integer ranging from 1 to 12, and y is an integer ranging from 1 to 4.

8. The organic semiconductor polymer of claim 1, wherein Ar is represented by following Chemical Formula (4):

[CHEMICAL FORMULA (4)]

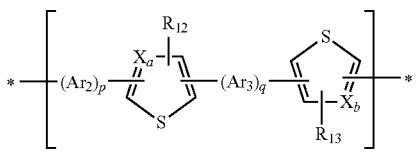

wherein, in the Chemical Formula (4),
$Ar_2$ and $Ar_3$ are independently a C6 to C30 arylene or a C6 to C30 heteroarylene,
p and q are independently 0 to 2,
$X_a$ and $X_b$ are independently N or CH, and
$R_{12}$ and $R_{13}$ are the same or different and are independently hydrogen or a C1 to C20 alkyl.

9. The organic semiconductor polymer of claim 1, wherein the organic semiconductor polymer includes a terminal functional group represented by one of the following Chemical Formulae (9) and (10):

[CHEMICAL FORMULA (9)]

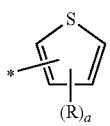

wherein, in the Chemical Formula (9),
R is a fluoro or a C1 to C20 perfluoroalkyl and a is an integer ranging from 1 to 3, and

[CHEMICAL FORMULA (10)]

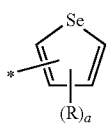

wherein, in the Chemical Formula (10),
R is a fluoro or a C1 to C20 perfluoroalkyl and a is an integer ranging from 1 to 3.

10. An electronic device, comprising the organic semiconductor polymer according to claim 1.

11. The electronic device of claim 10 being one selected from the group consisting of a memory device, a photovoltaic device, a laser device, an electronic paper, a radio-frequency identification (RFID) tag, a flat-panel display including an active-matrix flat-panel display, an organic light emitting diode (OLED), a plasma display panel (PDP) or a surface-conduction electron-emitter display (SED), and a sensor including a photosensor, biosensor, a chemical sensor or combinations thereof.

12. A transistor, comprising the organic semiconductor polymer according to claim 1.

13. The transistor of claim 12, wherein $R_9$ is one selected from the group consisting of the fluoro, the C1 to C20 partially fluorinated fluoroalkyl, the C1 to C20 perfluoroalkyl ($C_nF_{2n+1}$) and combinations thereof.

14. The transistor of claim 12, wherein $R_1$ and $R_2$ are the same or different and are independently selected from the group consisting of the fluoro, the C1 to C20 partially fluorinated fluoroalkyl, the C1 to C20 perfluoroalkyl ($C_nF_{2n+1}$) and combinations thereof.

15. The transistor of claim 12, wherein $R_9$ is one selected from the group consisting of the fluoro, the C1 to C20 partially fluorinated fluoroalkyl, the C1 to C20 perfluoroalkyl ($C_nF_{2n+1}$) and combinations thereof, and
$R_1$ and $R_2$ are the same or different and are independently selected from the group consisting of the fluoro, the C1 to C20 partially fluorinated fluoroalkyl, the C1 to C20 perfluoroalkyl ($C_nF_{2n+1}$) and combinations thereof.

16. The transistor of claim 12, wherein the organic semiconductor polymer is a p-type polymer.

17. The transistor of claim 12, wherein Ar includes at least one thiophene moiety.

18. The transistor of claim 12, wherein Ar is represented by following Chemical Formula (2):

[CHEMICAL FORMULA (2)]

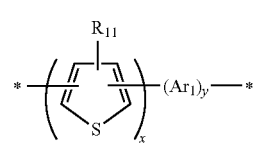

wherein, in the Chemical Formula (2),
$R_{11}$ is hydrogen, or a C1 to C20 alkyl,
$Ar_1$ is selected from the group consisting of a C6 to C30 arylene, a C6 to C30 condensed polycycle, and combinations thereof,
x is an integer ranging from 1 to 12, and
y is an integer ranging from 1 to 4.

19. The transistor of claim 12, wherein Ar is represented by following Chemical Formula (4):

[CHEMICAL FORMULA (4)]

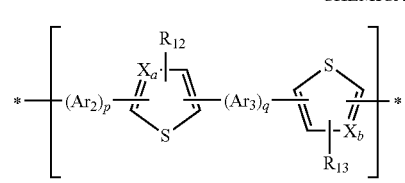

wherein, in the Chemical Formula (4),
$Ar_2$ and $Ar_3$ are independently a C6 to C30 arylene or a C6 to C30 heteroarylene,
p and q are independently 0 to 2,
$X_a$ and $X_b$ are independently N or CH, and
$R_{12}$ and $R_{13}$ are the same or different and are independently hydrogen or a C1 to C20 alkyl.

20. The transistor of claim 12, wherein the organic semiconductor polymer comprises a terminal functional group represented by one of following Chemical Formulae (9) and (10):

[CHEMICAL FORMULA (9)]

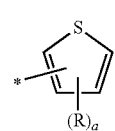

wherein, in the Chemical Formula (9),
R is a fluoro or a C1 to C20 perfluoroalkyl and a is an integer ranging from 1 to 3, and

CHEMICAL FORMULA (10)

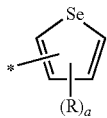

wherein, in the Chemical Formula (10),
R is a fluoro or a C1 to C20 perfluoroalkyl and a is an integer ranging from 1 to 3.

21. The transistor of claim 12, further comprising:
a gate electrode;
a source electrode and a drain electrode facing each other and defining a channel region;
an insulation layer that electrically insulates the source electrode, drain electrode and the gate electrode; and
an active layer including the organic semiconductor polymer in the channel region.

22. An electronic device, comprising the transistor according to claim 12.

23. The electronic device of claim 22 being one selected from the group consisting of a memory device, a photovoltaic device, a laser device, an electronic paper, a radio-frequency identification (RFID) tag, a flat-panel display including an active-matrix flat-panel display, an organic light emitting diode (OLED), a plasma display panel (PDP) or a surface-conduction electron-emitter display (SED), and a sensor including a photosensor, biosensor, a chemical sensor or combinations thereof.

24. The transistor of claim 12, wherein Ar is represented by following Chemical Formula (5):

CHEMICAL FORMULA (5)

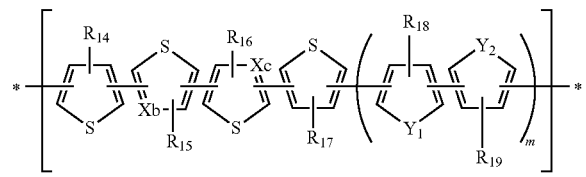

wherein, in the Chemical Formula (5),
$X_b$ and $X_c$ are the same or different and are independently N or CH,
$Y_1$ and $Y_2$ are the same or different and are independently S or Se,
$R_{14}$ to $R_{19}$ are the same or different and are independently hydrogen or a C1 to C20 alkyl, and
m is 0 to 2.

25. The transistor of claim 24, wherein Ar is represented by either Chemical Formula (5-1) or (5-2):

CHEMICAL FORMULA (5-1)

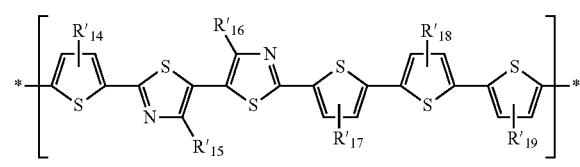

CHEMICAL FORMULA (5-2)

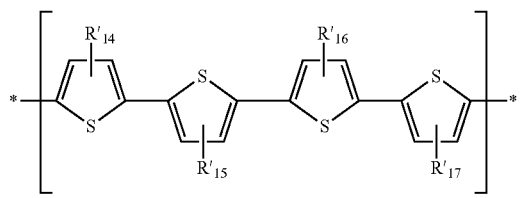

wherein, in the Chemical Formula (5-1) and (5-2),
$R'_{14}$ to $R'_{19}$ are the same or different and are independently hydrogen or a C1 to C20 alkyl.

26. An organic semiconductor polymer represented by following Chemical Formula (1):

CHEMICAL FORMULA (1)

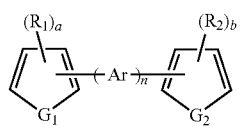

wherein, in the Chemical Formula (1),
$G_1$ and $G_2$ are the same or different and are independently selected from the group consisting of —O—, —S—, —Se—, and —$CR_9$=N—, where $R_9$ is one selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof,
$R_1$ and $R_2$ are the same or different and are independently selected from the group consisting of hydrogen, a fluoro, a C1 to C30 linear or branched alkyl, a C3 to C30 cycloalkyl, a C1 to C20 partially fluorinated fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl and combinations thereof,
n is a polymerization degree and an integer of 8 or more,
a and b are independently integers ranging from 1 to 3, provided that if $G_1$ and $G_2$ are —O—, —S—, or —Se—, then at least one of $R_1$ and $R_2$ is a fluoro or a C1 to C20 perfluoroalkyl, and provided that if $G_1$ and $G_2$ are —$CR_9$=N—, at least one of $R_1$, $R_2$ and $R_9$ is a fluoro or a C1 to C20 perfluoroalkyl, and
Ar is represented by following Chemical Formula (5):

CHEMICAL FORMULA (5)

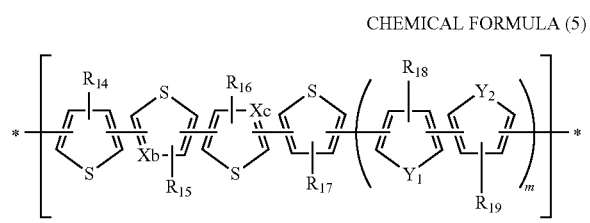

wherein in the Chemical Formula (5),
$X_b$ and $X_c$ are the same or different and are independently N or CH, $Y_1$ and $Y_2$ are the same or different and are independently S or Se, $R_{14}$ to $R_{19}$ are the same or different and are independently hydrogen or a C1 to C20 alkyl, and m is 0 to 2.

27. The organic semiconductor polymer of claim 26, wherein Ar is represented by either Chemical Formula (5-1) or (5-2):

CHEMICAL FORMULA (5-1)

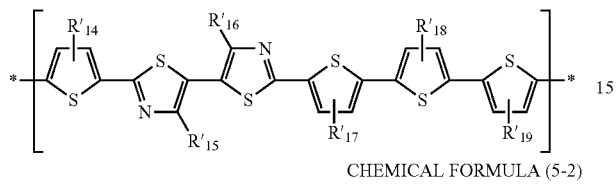

CHEMICAL FORMULA (5-2)

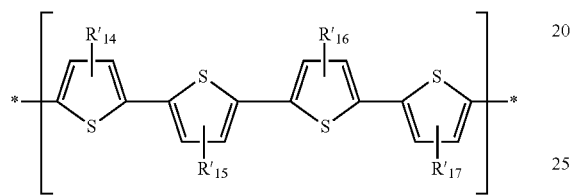

wherein, in the Chemical Formula (5-1) and (5-2), $R'_{14}$ to $R'_{19}$ are the same or different and are independently hydrogen or a C1 to C20 alkyl.

* * * * *